US007679160B2

(12) United States Patent
Udrea et al.

(10) Patent No.: US 7,679,160 B2
(45) Date of Patent: Mar. 16, 2010

(54) SEMICONDUCTOR DEVICE AND METHOD OF FORMING A SEMICONDUCTOR DEVICE

(75) Inventors: Florin Udrea, Cambridge (GB); Gehan Anil Joseph Amaratunga, Cambridge (GB)

(73) Assignee: Cambridge Semiconductor Limited, Cambridge (GB)

( * ) Notice: Subject to any disclaimer, the term of this patent is extended or adjusted under 35 U.S.C. 154(b) by 1202 days.

(21) Appl. No.: 11/216,197

(22) Filed: Sep. 1, 2005

(65) Prior Publication Data
US 2006/0067137 A1    Mar. 30, 2006

Related U.S. Application Data

(60) Provisional application No. 60/606,899, filed on Sep. 3, 2004.

(51) Int. Cl.
*H01L 29/93* (2006.01)

(52) U.S. Cl. .................. 257/492; 257/493; 257/656; 257/E29.336

(58) Field of Classification Search .................. 257/409, 257/492, 493, 656, E29.336; 438/109
See application file for complete search history.

(56) References Cited

U.S. PATENT DOCUMENTS

| 3,549,963 | A | * | 12/1970 | Simons ....................... 361/234 |
| 3,689,992 | A | | 9/1972 | Schutze et al. |
| 4,694,480 | A | * | 9/1987 | Skillicorn ..................... 378/119 |
| 5,241,210 | A | | 8/1993 | Nakagawa et al. |
| 5,373,183 | A | | 12/1994 | Beasom |
| 5,378,920 | A | | 1/1995 | Nakagawa et al. |
| 5,420,458 | A | | 5/1995 | Shimoji |
| 5,430,316 | A | | 7/1995 | Contiero et al. |
| 5,434,444 | A | | 7/1995 | Nakagawa et al. |
| 5,463,243 | A | | 10/1995 | Sakurai et al. |
| 5,468,982 | A | | 11/1995 | Hshieh et al. |
| 5,608,267 | A | | 3/1997 | Mahulikar et al. |

(Continued)

FOREIGN PATENT DOCUMENTS

WO    WO 94/22167    9/1994

(Continued)

OTHER PUBLICATIONS

International Search Report for International Application No. PCT/GB2005/003382, dated Dec. 23, 2005.

*Primary Examiner*—Kiesha R Bryant
*Assistant Examiner*—Monica D Harrison
(74) *Attorney, Agent, or Firm*—Pillsbury Winthrop Shaw Pittman, LLP

(57) ABSTRACT

A high voltage/power semiconductor device has at least one active region having a plurality of high voltage junctions electrically connected in parallel. At least part of each of the high voltage junctions is located in or on a respective membrane such that the active region is provided at least in part over plural membranes. There are non-membrane regions between the membranes. The device has a low voltage terminal and a high voltage terminal. At least a portion of the low voltage terminal and at least a portion of the high voltage terminal are connected directly or indirectly to a respective one of the high voltage junctions. At least those portions of the high voltage terminal that are in direct or indirect contact with one of the high voltage junctions are located on or in a respective one of the plural membranes.

31 Claims, 28 Drawing Sheets

U.S. PATENT DOCUMENTS

| | | |
|---|---|---|
| 5,631,491 A | 5/1997 | Matsuzaki |
| 5,895,972 A | 4/1999 | Paniccia |
| 6,008,126 A | 12/1999 | Leedy |
| 6,040,617 A | 3/2000 | Patel |
| 6,069,396 A | 5/2000 | Funaki |
| 6,365,932 B1 | 4/2002 | Kouno et al. |
| 6,396,148 B1 * | 5/2002 | Eichelberger et al. ....... 257/758 |
| 6,703,684 B2 * | 3/2004 | Udrea et al. ................ 257/548 |

FOREIGN PATENT DOCUMENTS

| | | |
|---|---|---|
| WO | WO 98/32009 | 7/1998 |
| WO | WO 02/25700 A2 | 3/2002 |
| WO | WO 2004/004013 A1 | 1/2004 |

* cited by examiner

SEMICONDUCTOR DEVICE AND METHOD OF FORMING A SEMICONDUCTOR DEVICE

This application claims the benefit of priority to U.S. application Ser. No. 60/606,899, filed Sep. 3, 2004, the content of which is hereby incorporated by reference.

The present invention relates to a semiconductor device and to a method of forming a semiconductor device.

The present invention is particularly concerned with high voltage semiconductor devices which can be used in power integrated circuits and is particularly concerned with lateral field-effect transistors, such as power LDMOSFETs, lateral insulated gate bipolar transistors (LIGBTs) and other types of power devices such as diodes, transistors and thyristors.

Lateral devices in integrated circuits have the main terminals (variously called the anode/cathode, drain/source and emitter/collector) and the control terminals (termed the gate or base) placed at the surface of the device in order to be easily accessible. In power ICs, such devices are often monolithically integrated with CMOS-type or BiCMOS-type low voltage/low power circuits. It is desirable that one or several high voltage/power devices be integrated within the same chip.

There are two main technologies that have emerged in the high voltage/power integrated circuit field. The first, Junction-Isolation (JI) technology, is based on using reverse-biased junctions for isolating adjacent devices. In this technology, the high voltage device incorporates a high voltage RESURF (Reduced SURface Field effect) type junction. This is based on a dual action of a lateral high voltage junction that comprises a drift region and a vertical junction that is formed between the drift region and the semiconductor substrate. The semiconductor substrate has a different conductivity type and is ideally more lowly doped than the drift region. In this case a depletion region forms deep into the semiconductor substrate (or a virtual substrate) as well as vertically in the drift region, resulting in a faster growth of the depletion region than that predicted by 1D junction. This allows the doping charge to be set at a higher value than that predicted by the one-dimensional Poisson theory. While this technique is satisfactory for unipolar devices such as MOSFETs, it is inappropriate for bipolar devices. Indeed, mobile carriers resulting from the bipolar action of the transistor can move through the semiconductor substrate, affecting the operation of other devices and slowing the power device considerably.

The second main technology for high voltage/power ICs is the Silicon-On-Insulator technology (SOI) and is based on using pre-processed semiconductor wafers featuring a buried insulating layer, typically made of an oxide, sandwiched between an active layer of semiconductor (above the buried oxide) and a semiconductor substrate (below the buried oxide). As in the Junction-Isolation technology, a high voltage device made in SOI technology incorporates a high voltage junction within the active area of the device to support laterally the voltage between a high voltage terminal and a low voltage terminal. However unlike in the junction-isolation technology, there is no depletion region building in the substrate. Nevertheless, the semiconductor substrate beneath the buried oxide acts as a field plate, leading to a similar RESURF effect which translates into a faster growth of the depletion region in the drift region. In this case all the potential lines eventually have to align with the buried oxide/semiconductor interface as the entire high voltage is dropped vertically across the oxide. This imposes a severe limit on the breakdown ability of the device in spite of a fast growth of the depletion region in the drift region. A thicker buried oxide and/or the use of other buried insulating materials with lower dielectric constants will lead to a slightly higher breakdown.

In general, it is not the buried oxide which breaks down first but the active layer of semiconductor (silicon) placed above. Indeed, the high electric field built in the buried oxide yields a high electric field in the semiconductor layer (at the interface with the buried oxide) which results in avalanche breakdown of the semiconductor. The buried oxide thickness or the use of other buried materials is limited by the technology. For buried oxides this thickness is about 4 µm. Besides, a too thick buried oxide will lead to self-heating which in turn damages the operation and the reliability of the power device.

For bipolar devices, such as the Insulated Gate Bipolar Transistor (IGBT), built in thin active silicon layers, the junctions can reach the buried oxide (as known in fully depleted or partially depleted SOI). In this case an undesirable punch-through type breakdown can occur. The voltage drop supported across the buried oxide can lead to the formation of a surface hole inversion layer in the n-buffer (n-well) and the n-drift region via the back gate MOS effect. When this inversion layer connects to the depletion region extending from the p-well, an undesirable punch-through effect occurs. The punch-through is therefore dependent on the thickness of the buried oxide. For example for a typical n-well concentration of $3 \times 10^{16}$ cm$^{-3}$ the n-well becomes inverted at about 30 V per every 1 µm of buried oxide. This undesirable punch-through breakdown is in many cases well below the actual avalanche breakdown of the device and therefore severely limits the breakdown ability of such structures.

Our U.S. Pat. No. 6,703,684 and WO-A-02/25700 and related patents and patent applications, the entire contents of which are hereby incorporated by reference, disclose a technique to allow a high breakdown voltage to be supported within a drift region embedded in a thin semiconductor membrane. This technique can be mainly applied (though is not restricted) to SOI structures whereby the buried oxide acts as an effective etch stop to define accurately a membrane in the drift region of a power device by removing entirely the silicon substrate under at least part of the drift region. The use of the membrane technology not only allows a significant increase in the avalanche breakdown but also removes the undesirable punch-through present in thin silicon LIGBTs. In addition, the membrane technology helps to reduce the cross-talk and increase the switching speed by considerably reducing the output capacitance. The membrane structure disclosed in these patents and patent applications are not RESURF-type structures (as in standard Junction-Isolation or SOI technologies) as there is no effect of the depletion region building in the substrate, nor is the substrate acting as a field plate. Indeed in Junction-Isolation a second depletion region builds in the drift region due to the substrate junction while in SOI the substrate acts as a field plate bending severely the potential lines and significantly affecting the potential and electric field distribution in the drift layer. Both these effects lead to a faster growth of the depletion region in the drift region, known in the state-of-the-art as the RESURF effect. Therefore the membrane power devices disclosed in the above-mentioned patents and patent applications can be regarded more as a 1D structure surrounded by dielectric materials and unless a superjunction (charge compensation technique) is used within the drift region, the doping charge in the drift layer in the membrane power devices must be set to a lower value than that of an equivalent RESURF-type structure to compensate for the absence of the substrate effect.

Placing a power device on the membrane, as disclosed in the above-mentioned patents and patent applications, may nevertheless lead to undesirable self-heating effects. A high temperature gradient is established between the centre of the membrane and its periphery. Increasing the static and dynamic power during operation may result in hotspots occurring at the centre of the membrane. In addition, scaling such devices for different output power levels will be an issue. For example, increasing the current capability of the device (for the same breakdown) requires increasing its active area. This can result in an undesirable increase in the temperature at the centre of the membrane and as a result a large temperature gradient between the centre of the device and the edge of the device. A power device may comprise several identical cells or fingers and since a large membrane will cause a temperature gradient from the centre of the cell to the edges, these cells will carry unbalanced currents in static and dynamic conditions, possibly leading to early failures and limiting considerably the use of the device.

In addition to the thermal drawback, by increasing the membrane size, the mechanical resistance of the structure is reduced considerably. This has severe implications on the processing, handling and packaging of such devices as well as yield and ultimately reliability.

There have been numerous other prior proposals for increasing the breakdown voltage of semiconductor devices, particularly power semiconductor devices. Examples are disclosed in U.S. Pat. No. 5,241,210, U.S. Pat. No. 5,373,183, U.S. Pat. No. 5,378,920, U.S. Pat. No. 5,430,316, U.S. Pat. No. 5,434,444, U.S. Pat. No. 5,463,243, U.S. Pat. No. 5,468,982, U.S. Pat. No. 5,631,491, U.S. Pat. No. 6,040,617, and U.S. Pat. No. 6,069,396. However, none of these prior art proposals has tackled the problem of increasing the breakdown voltage by a detailed consideration of the electric potential lines in the drift region.

In WO-A-98/32009, there is disclosed a gas-sensing semiconductor device. A gas-sensitive layer is formed over a MOSFET heater which is used to heat the gas-sensitive layer. The substrate on which the device is formed is back-etched to form a thin membrane in the sensing area. It should be noted that the MOSFET heater is a low voltage device (and as such does not have a drift region) and, furthermore, the thin membrane is formed below the MOSFET heater solely to facilitate heating of the sensing area to very high temperatures and not to affect the field or potential lines in the device.

U.S. Pat. No. 5,895,972 discloses a method and apparatus for cooling a semiconductor device during the testing and debugging phases during development of a device. In place of conventional heat slugs such as copper, a heat slug of material that is transparent to infra red is fixed to the device. A diamond heat slug is disclosed as preferred. It is disclosed that the substrate on which the device is formed can be thinned prior to applying the infra red transparent heat slug to the device. The purpose of this thinning of the substrate is to reduce transmission losses that occur during optical testing and debugging of the device using infra red beams. There is no discussion of the type of semiconductor device to which the heat slug is applied and there is no disclosure that the device is a power device having a drift region. Moreover, as stated, the purpose of the thinning of the substrate and application of the heat slug is solely to facilitate testing of the device using optical testing and debugging. This process is carried out during development of the device. The heat slug is not used during normal operation of the device.

There have been a number of other proposals in the prior art for semiconductor devices which make use of a so-called membrane. Examples include U.S. Pat. No. 5,420,458, WO-A-94/22167, U.S. Pat. No. 3,689,992 and U.S. Pat. No. 6,008,126. In the case of each of these prior art proposals, the semiconductor device is not a power device and thus does not have a drift region. In each case, the membrane arrangement is used to provide for isolation between semiconductor devices in an integrated circuit or between regions within a semiconductor device and/or to remove or lower coupling parasitic capacitances. In each case, since these are low voltage devices, the breakdown voltage is virtually unaffected by the membrane structure.

The term "membrane" as used herein refers to a thin region, which either consists of a semiconductor layer or which is formed of several layers at least one of which is a semiconductor layer. The membrane may be mechanically clamped to the semiconductor substrate of the device only at its periphery. There is for example no direct connection of a semiconductor substrate to the top or the bottom of the membrane.

According to a first aspect of the present invention, there is provided a high voltage/power semiconductor device, the device comprising: at least one active region having a plurality of high voltage junctions, electrically connected in parallel, at least part of each of said high voltage junctions being located in or on a respective membrane such that the active region is provided at least in part over plural membranes, there being non-membrane regions between said membranes; a low voltage terminal; and, a high voltage terminal; at least a portion of the low voltage terminal and at least a portion of the high voltage terminal being connected directly or indirectly to a respective one of the high voltage junctions; at least those portions of the high voltage terminal that are in direct or indirect contact with one of the high voltage junctions being located on or in a respective one of the plural membranes.

The high voltage junctions effectively act electrically as a single electrical junction. The high voltage junction is a p-n junction with at least one of the sides (p or n) being more lowly doped and relatively longer to withstand a high voltage across the main terminals in the voltage blocking mode, the junction being reverse biased. This lowly doped region is referred to as the drift region. It should be understood that the term "junction" as used in the art and herein refers to the combination of the p region, the n region and the interface (often known as the "physical junction") between the p region and the n region, and not merely the interface as such.

The high voltage junctions are typically each a junction with one side comprised of a drift region of the power device which is in or on the membrane. The bottom surface of the membranes have no semiconductor substrate positioned adjacent thereto. The non-membrane region has semiconductor substrate positioned beneath. In this way, in use the high voltage applied between the low voltage and high voltage terminals is supported in the semiconductor layer within the high voltage junctions situated within the membranes. At the same time, the heat generated during device operation can dissipate from the active region of the device through the non-membrane region(s) down to the semiconductor substrate typically provided in use under the non-membrane region(s). The multiple membranes thus ensure a much more effective heat dissipation, leading to considerably less self-heating than that of a single membrane occupying an equivalent area for a given current in a high voltage/power device. The plural membranes have overall a considerably higher mechanical resistance than a single membrane occupying an equivalent area for a given high voltage/power device.

The trench or other regions below the membranes may be a vacuum or may contain air or for example an inert gas with high breakdown strength. Preferably, the space below the membranes is hermetically sealed during encapsulation of the device. Such sealant can be for example an organic material, such as a polymer or an epoxy, a metal plate or a thin glass. In an alternative arrangement, the device is bonded (on the back surface) to a glass or soldered to a metal plate.

In another embodiment, the trench or similar beneath the membrane can be filled partly or entirely with a solid material to passivate the surface and/or provide a better thermal path and/or provide better mechanical robustness. Such material can be a dielectric, such as oxide, glass nitride or an organic material, such as a polymer or polyamide. In case the trench is entirely or substantially entirely filled with a solid material, the term "membrane" strictly applies only to a step in the fabrication of the device and not to a fully fabricated device.

Each membrane is preferably long and narrow to allow an optimum trade-off between the breakdown/current capability on one hand and high mechanical strength and relatively good thermal dissipation on the other hand. Each membrane preferably has a rectangular shape with a high length/width aspect ratio. For example the aspect ratio may be in the range 5:1 to 40:1. In a particular example, a membrane can be 1 mm-2 mm long and 50-200 microns wide. Each membrane preferably has slightly rounded corners to avoid high electric fields.

Depending on the device, the high voltage terminal may be for example the drain, anode or collector of the device, and the low voltage terminal may be for example the source, cathode, and emitter respectively. The high voltage/power device of the present invention may be of many different types, including for example a diode, a transistor, a thyristor, a MOS-controllable device such as an LDMOSFET, a lateral insulated gate bipolar transistor (LIGBT), a double gate device, a superjunction type device as known for example in 3D-RESURF, etc. The voltage range of such devices is typically above 20 V and below 1.2 kV while its current capability can vary from as small as few mAmps to a few Amps. The power dissipation of such devices can be typically in the range of few mWatts to a few or tens of Watts. At least part of the high voltage terminal is preferably placed within the centre of a membrane where it connects to the active area and directly or indirectly (through the means of other junctions or regions of semiconductors) to the high voltage junction. The high voltage traverses the edge of the membrane on one side of the membrane above several layers of insulators (e.g. silicon oxide) in order to connect to the high voltage pad. All the pads for all the terminals are preferably placed outside the membrane region (i.e. above several layers of insulators situated above the silicon substrate).

In an embodiment, at least one of those portions of the low voltage terminal that are in direct or indirect contact with one of the high voltage junctions is located on or in a non-membrane region.

In an embodiment, all of those portions of the low voltage terminal that are in direct or indirect contact with one of the high voltage junctions are located on or in a non-membrane region.

In an embodiment, the high voltage terminal and the low voltage terminal have an interdigitated structure.

In an embodiment, the device comprises a control terminal located adjacent the low voltage terminal.

The potential applied in use to the control terminal (e.g. the gate) is usually referred to the potential of the low voltage terminal.

In an embodiment, at least one edge of at least one of the membranes is at least partly protected by a top field plate. This reduces the risk of forming high electric fields at the edge of the membrane. Such field plates can be made of polysilicon or metal layers placed on dielectric and covering the edge of the membrane. The field plates can be connected to ground or source or gate terminals. The field plate can run along (and above) the entire perimeter of the membrane.

In an embodiment, the device comprises an insulating layer over the top of the device. This insulating layer is typically relatively thick and mechanically strong and increases the overall mechanical strength of the device. This layer may also serve to protect the device against breakdown at the top surface of the power device. A suitable material for this layer is polyimide. The layer can be formed on top of the power device after CMOS production is complete, but in any event is preferably formed before the membranes are formed.

In an embodiment, the device comprises a conformal layer made of an insulating material on the bottom of at least one of the membranes. The conformal layer is preferably mechanically strong, and preferably has good passivation properties (e.g. barrier against moisture). The conformal layer increases the overall mechanical resistance of the device and helps to prevent air breakdown and/or reduces the effect of parasitic charge contamination. Such a layer is preferably formed after the membranes are formed and can be made for example of nitride, oxide or organic material, such as a polymer or polyamide.

In an embodiment, the device comprises a layer made of an insulating material which fills the entire bottom of at least one of the membranes. The layer is preferably mechanically strong and preferably has good passivation properties (e.g. barrier against moisture). Such layer can increase the overall mechanical resistance of the device and reduces or suppresses the effect of parasitic charge contamination. Such a layer is preferably formed after the membranes are formed and can be made for example of nitride, oxide, glass, a ceramic or epoxy or an organic material, such as a polymer or polyamide.

In an embodiment, at least one of the membranes is formed by dry back etching. This technique, the preferred form of which is deep reactive ion etching (RIE), is particularly useful when applied to form plural membranes as it allows the formation of narrow membranes and, crucially, narrow spacing between membranes. This is particularly valuable in allowing the power de-vice to be made small and avoids impractically large dimensions in an integrated circuit. Alternatively the membranes can be formed by anisotropic KOH etching in 110 silicon substrates which ensures vertical (or practically vertical) walls. This technique has however the disadvantage of less anisotropic properties and less control on the final dimensions of the membranes when compared to the deep RIE technique. The well-known deep wet back-etching using for example KOH in 100 silicon substrates is however unsuitable for this aspect of the present invention. This is because multiple membranes cannot be built with narrow spacing between them. A combination of deep RIE finished and wet etching (e.g. using TMAH or KOH) may however be appropriate.

In an embodiment, the device comprises a buried oxide layer which acts as an etch stop during formation of at least one of the membranes using wet etching. The use of such a buried oxide layer is known per se in silicon-on-insulator (SOI) structures. This layer also provides a charge and moisture barrier and helps to prevent catastrophic air breakdown above 300V. The buried oxide also withstands a high voltage when the membrane power device is operated in the high side with the low voltage terminal elevated above the substrate potential (by say a few hundred volts). The buried oxide plays therefore a major part in making and operation of a power device featuring multiple and dense membranes.

In an embodiment, the device comprises a semiconductor or glass cap placed above the device at a distance from the top surface of the device.

The semiconductor or glass cap protects the power device during encapsulation (e.g. during plastic moulding) and/or dicing. The cap also helps to reduce the mechanical stress of the power device within the package while in operation. By using a semiconductor (silicon) cap, the membranes can move freely and this helps to reduce its stress in the device due for example to different expansion of its layers when operated at elevated temperatures. The cap can be formed before or after the chips have been diced. The distance from the top surface of the power device is necessary to avoid perturbation of the electric field distribution during the blocking mode of the power device. The cavity formed above the top surface of the membrane and the bottom of the cap may be a vacuum or may contain air or for example an inert gas with high breakdown strength. Preferably, the cavity is hermetically sealed (by bonding, soldering or other method) during encapsulation of the device. The membrane can be filled entirely with an appropriate material having good insulating and passivation properties.

The device may be for example a bipolar-MOS structure, such as a lateral insulated gate bipolar transistor (LIGBT); a power Field Effect Transistor (FET), such as a lateral high voltage Metal Oxide Field Effect Transistor (MOSFET); a power Bipolar Junction Transistor (BJT); a power diode or a PIN diode; a superjunction or 3D RESURF high voltage device; a superjunction or 3D RESURF FET; a 3D RESURF bipolar-MOS structure such as a superjunction or 3D RESURF LIGBT; a superjunction or 3D RESURF diode.

There may be provided in combination, a device as described above and a further high voltage/power device integrated monolithically in the same chip.

The high voltage/power devices may operate in a half bridge, active clamp or any other configuration known in the state-of-art power electronics.

At least part of the active area of each of the high voltage/power devices is preferably placed in or on a membrane.

Said at least part of the active area of each of the high voltage/power devices may be placed in or on respective membranes or at least some of them may share a membrane.

Besides one or more high voltage/power devices, such a power integrated circuit may contain, where appropriate, a low side gate driver and a high side gate driver, as well as analogue, digital or mixed analogue-digital controllers. Protection circuits for the high voltage/power device may also be provided. The high side gate driver may operate at an elevated potential compared to the low side driver.

There may be provided in combination, a device as described above and a high side gate driver in or on at least one further membrane.

In this embodiment, the high side gate driver, and preferably any associated electronics which may operate at an elevated potential when compared to the substrate potential, is embedded in at least one other membrane. The membrane plays an important role in allowing a high voltage to be supported between any terminals of the high side gate driver or associated electronics and the semiconductor substrate. The semiconductor substrate is preferably connected to ground.

There may be provided in combination, a device as described above and a further high voltage/power device that share a common set of membranes.

The first device can be for example a lateral insulated gate bipolar transistor while the second device can be an antiparallel diode. In a typical implementation of this embodiment, the active area of the diode effectively sits adjacent the active area of the LIGBT while both are distributed within a common set of membranes. In another implementation of this embodiment, the active area of the two devices are interlaced. Alternatively, the device having a higher avalanche breakdown (e.g. the diode) is placed at the edges of the membranes while the device with the lower intrinsic avalanche breakdown in placed in the middle. This is done to prevent premature edge breakdown and to optimise the overall breakdown capability of the two devices when connected together.

According to a second aspect of the present invention, there is provided a method of forming a high voltage/power semiconductor device, the method comprising: forming, in a layer provided on a semiconductor substrate, a high voltage/power semiconductor device having an active region having a plurality of high voltage junctions electrically connected in parallel; forming a low voltage terminal and a high voltage terminal such that at least a portion of the low voltage terminal and at least a portion of the high voltage terminal are connected directly or indirectly to a respective one of the high voltage junctions; removing the semiconductor substrate below at least part of the high voltage junctions such that at least part of each of said high voltage junctions is located in or on a respective membrane whereby the active region is provided at least in part over plural membranes, there being non-membrane regions between said membranes; and, removing at least a portion of the semiconductor substrate below at least those portions of the high voltage terminal that are in direct or indirect contact with one of the high voltage junctions such that at least those portions of the high voltage terminal that are in direct or indirect contact with one of the high voltage junctions are located on or in a respective one of the plural membranes.

The method may comprise forming at least one high voltage junction in the active region, and directly or indirectly connecting the high voltage terminal and the low voltage terminal to the high voltage junction.

The method may comprise forming plural high voltage terminal portions on or in a respective membrane.

The method may comprise forming plural low voltage terminal portions on or in a respective membrane.

The method may comprise forming at least one of the membranes using dry back etching.

The method may comprise forming a buried oxide layer and then forming at least one of the membranes using wet etching with the buried oxide layer acting as an etch stop during formation of said at least one of the membranes.

Thus, the preferred embodiments of the present invention provide a high voltage semiconductor device that is suspended on multiple, relatively narrow, membranes to achieve simultaneously a high breakdown capability, relatively good mechanical resistance, and effective heat dissipation from the active layer within the membrane through the semiconductor/metal/insulator pillows placed between the membranes down to the silicon substrate and, where provided, to a heat sink.

Power devices typically operate with a voltage in the range 20V to 1.2 kV and typically higher than 30V or 50V or so, and a current in the range 10 mA to 50 A and typically higher than 0.5 A. Such devices may also be referred to as "high voltage/power devices". These devices are typically capable of dissipating from a few mWatts to 1 Watt or even a few tens of Watts of power. Their application may range from domestic appliances, electric cars, motor control, and power supplies to RF and microwave circuits and telecommunication systems.

It will be appreciated that the terms "top" and "bottom", "above" and "below", and "lateral" and "vertical", are all used in this specification by convention and that no particular physical orientation of the device as a whole is implied.

Embodiments of the present invention will now be described by way of example with reference to the accompanying drawings, in which.

Figure 27:
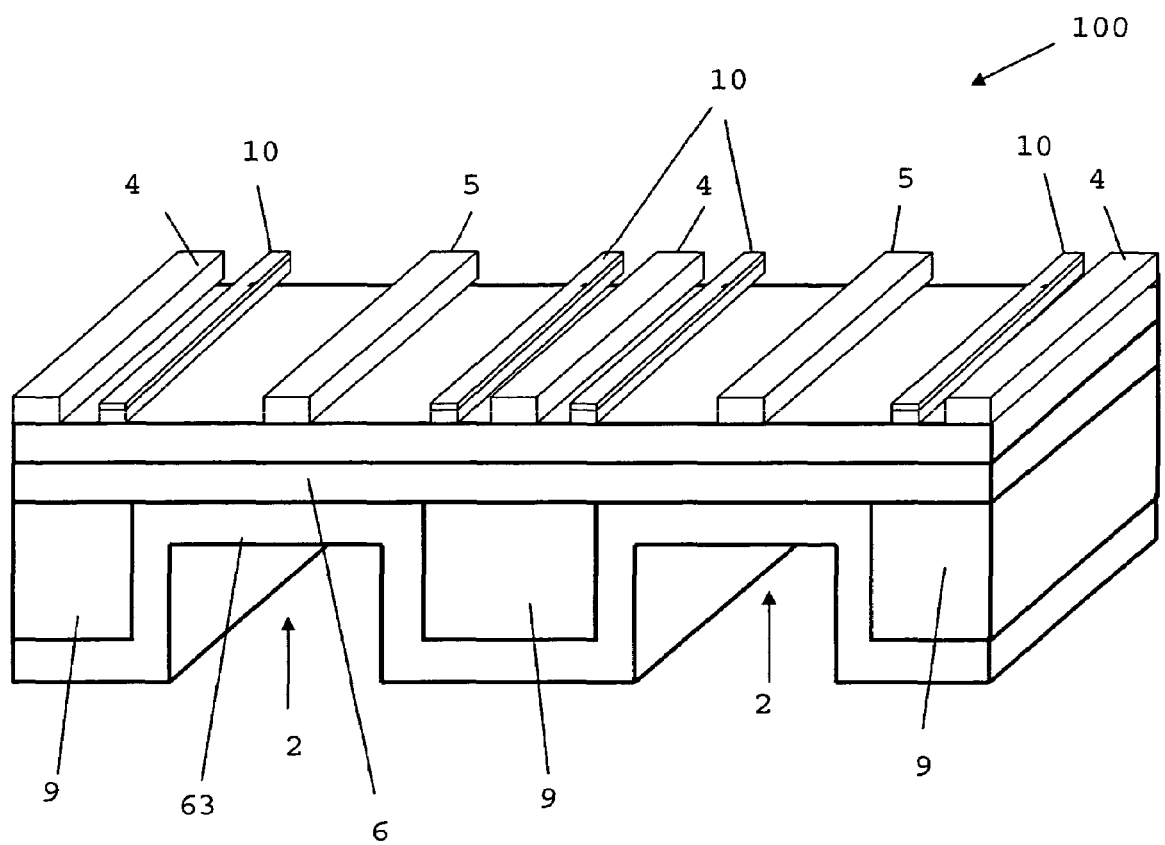
Figure 28:
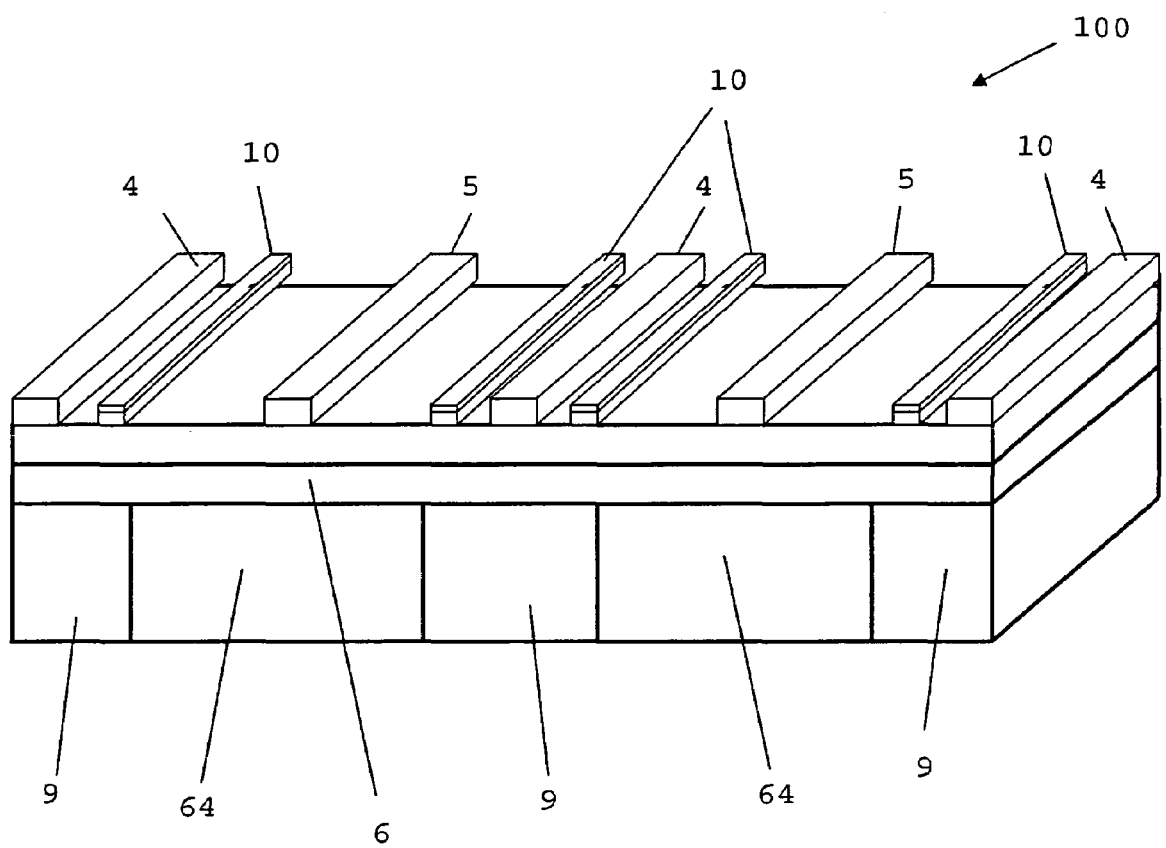

FIG. 27 shows schematically a top three-dimensional view of an example of a power device according to an embodiment of the present invention featuring a conformal layer added to the bottom of the membrane(s); and, FIG. 28 shows schematically a top three-dimensional view of an example of a power device according to an embodiment of the present invention featuring a dielectric layer added to the bottom of the membrane(s) which fills the entire gap below the membrane(s).

Figure 1:
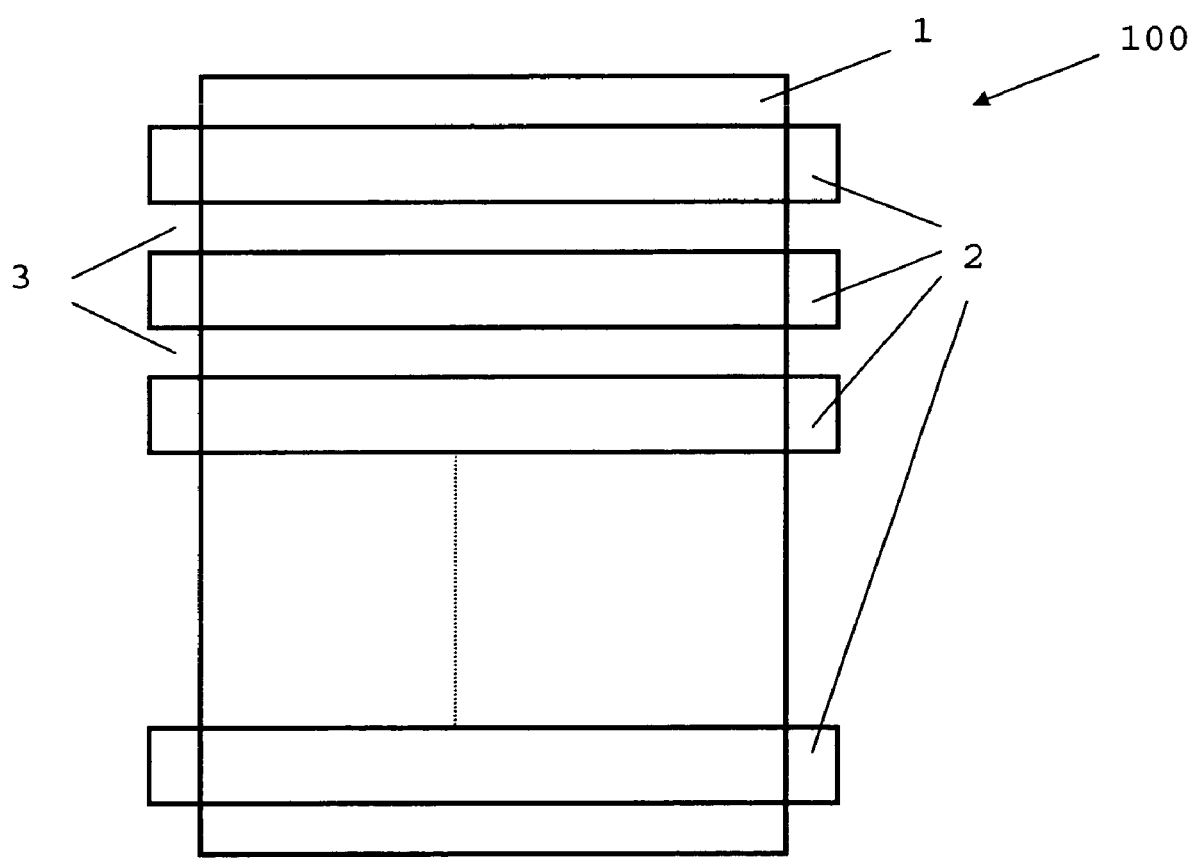
FIG. 1 shows a schematic top view of an example of a power device according to an embodiment of the present invention.

Referring to FIG. 1, an example of a power device 100 according to an embodiment of the present invention has an active area 1 placed across multiple membranes 2 between which are non-membrane regions 3.

Preferably all the membranes 2 have the same or similar dimensions and the spacing between membranes 2 is the same or similar. The dimensions of the membranes and the spacing between membranes 2 may however be different and for example may be optimised to allow improved heat dissipation. The membranes 2 preferably have a rectangular shape with a relatively high length/width aspect ratio to optimise the electrical power and heat distribution. The membranes 2 may be rounded at the edges to avoid high mechanical stresses built at the corners and also avoid crowding of the electric field which may lead to premature failure.

Figure 2:
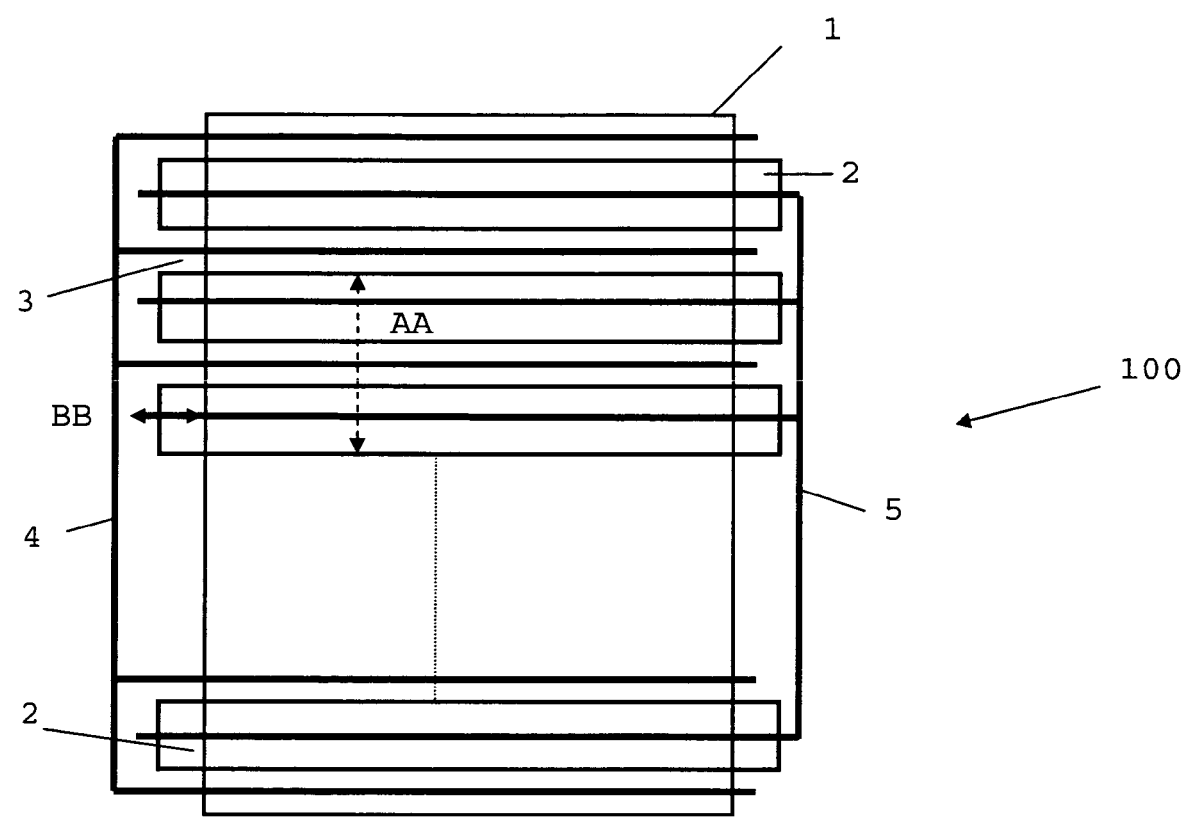
FIG. 2 shows a more detailed top view of FIG. 1.

FIG. 2 is a more detailed top view of the device 100 of FIG. 1 showing a low voltage terminal 4 and a high voltage terminal 5. The control terminal (e.g. gate) is not shown. The two main terminals 4, 5 in this example are arranged in a well-known interdigitated pattern. It can be seen that the low voltage terminal 4 extends (only) across the regions 3 between the membranes 2 and that the high voltage terminal 5 extends (only) across the membranes 2.

Figure 3A:
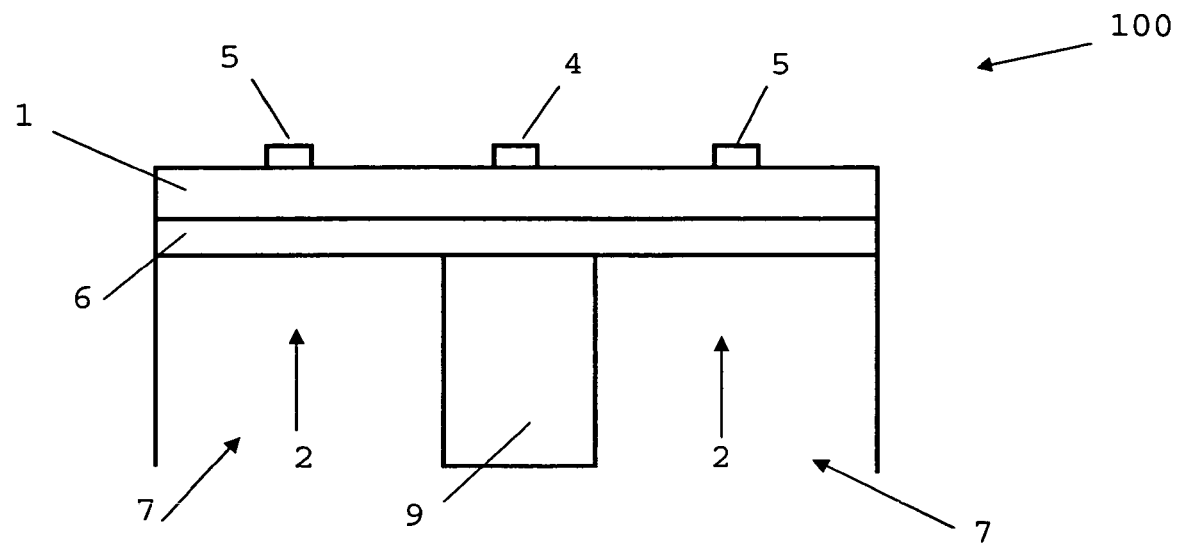
FIGS. 3A and 3B shows schematic cross-sectional views on A-A and B-B of FIG. 2 respectively.
Figure 3B:
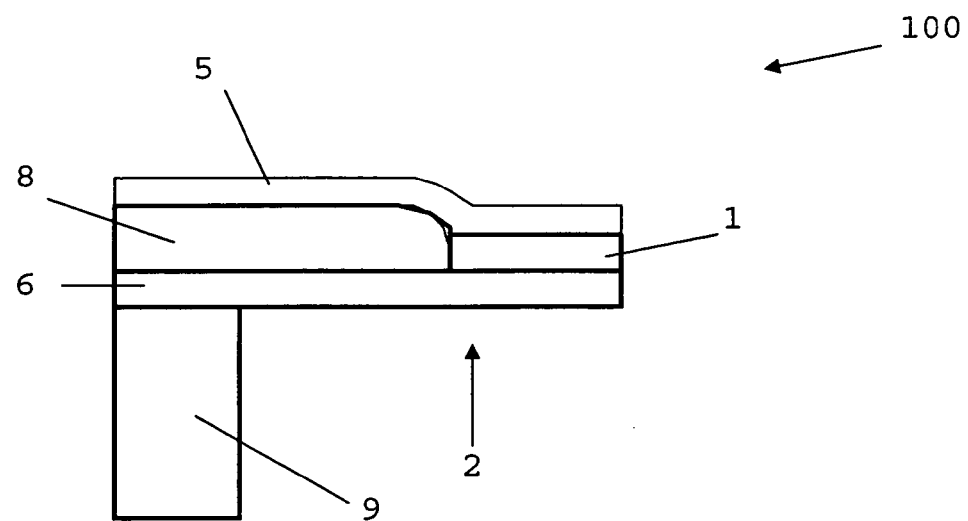

FIGS. 3A and 3B are schematic cross-sectional views on A-A and B-B of FIG. 2 respectively. Layer 6 is the buried oxide which has a dual use, namely as electrical isolation and as an etch stopper. The gaps 7 underneath the membranes 2 can be seen. Dielectric material 8 used for lateral isolation between devices 100 and the semiconductor (silicon) substrate 9 is also shown.

Figure 4:
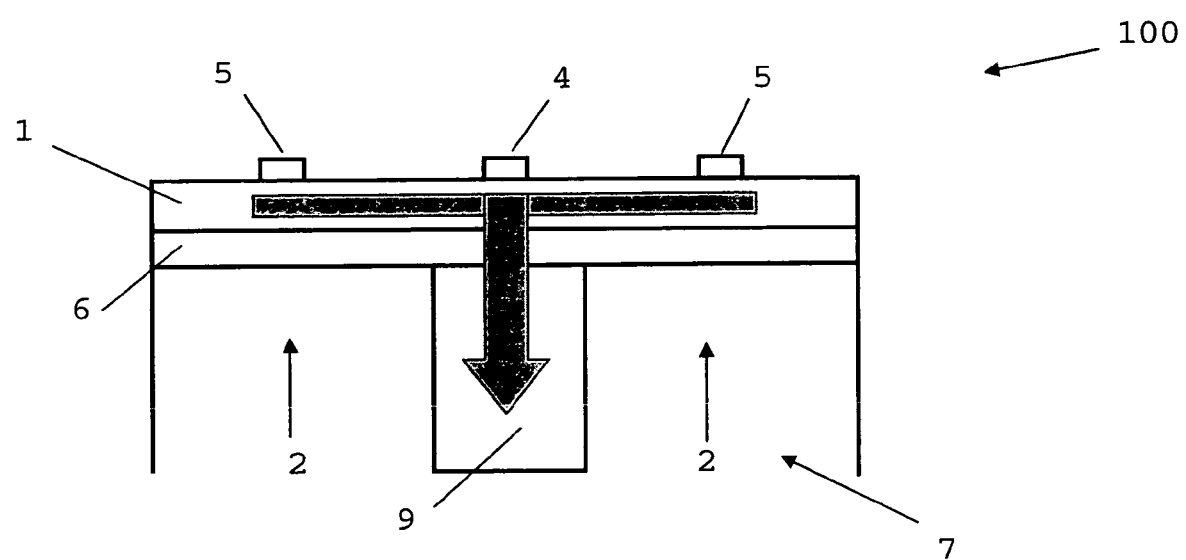
FIG. 4 shows schematically the heat dissipation through the semiconductor substrate placed between two adjacent membranes in an example of a device according to an embodiment of the present invention.

FIG. 4 shows schematically the heat dissipation through the semiconductor (silicon) substrate 9 placed between two adjacent membranes 2 for the device 100. As can be seen, there is an effective conduction of heat from the regions of the active area 1 of the device 100 under the terminals 4, 5 (i.e. the parts of the active area 1 of the device 100 that are mounted on or in the membranes 2) to the semiconductor substrate 9, from where the heat can be removed altogether by a heat sink (not shown) that is thermally coupled to, e.g. by direct contact with, the bottom of the substrate 9. (Such a heat sink may be provided in all examples described in the present application.) This heat conduction is particularly valuable from the regions under the high voltage terminal 5 because it is otherwise difficult for heat to escape from the regions above the membranes 2. It will also be appreciated from this figure that the arrangement of two relatively smaller membranes 2 with a supporting substrate 9 therebetween will have greater mechanical strength than an equivalently sized relatively larger membrane which has no support under its central portion.

Figure 5:
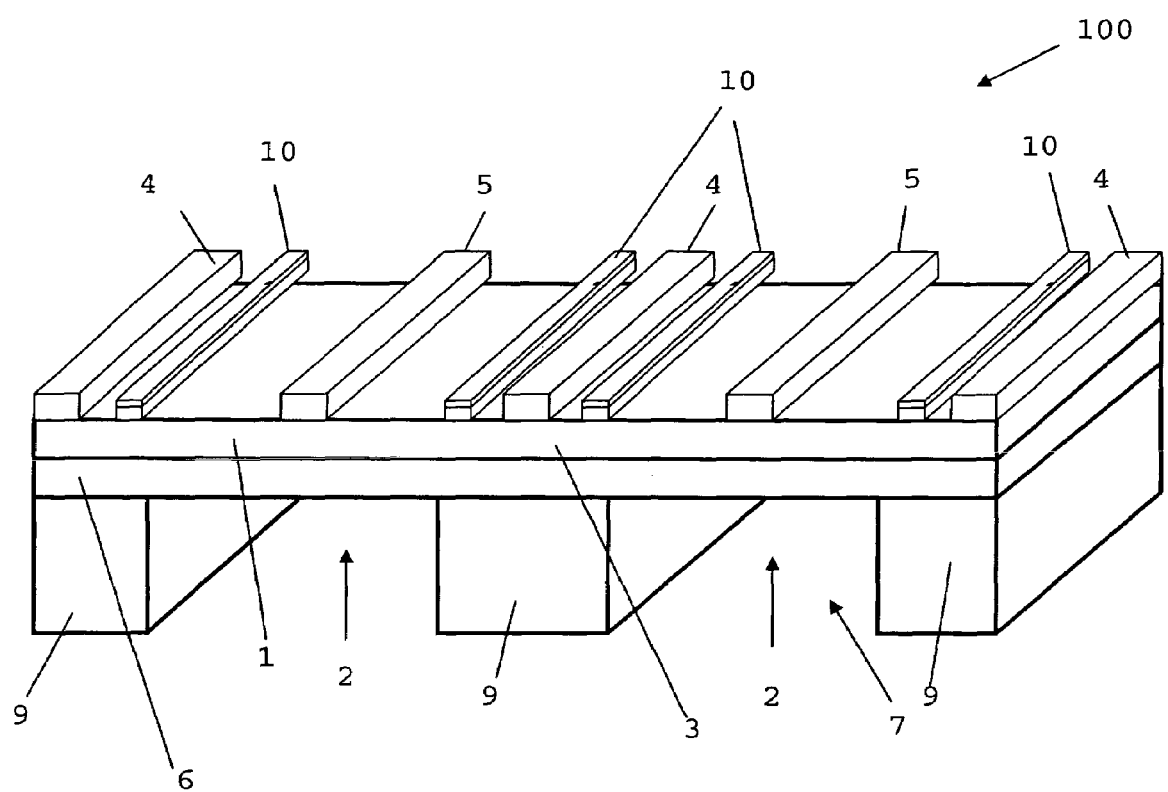
FIG. 5 shows a schematic three dimensional view of an example of a device according to an embodiment of the present invention.

FIG. 5 shows a schematic three dimensional view of the power device 100. In this figure, there is shown the gate terminal 10 comprised of a gate oxide (bottom) and a metal and/or polysilicon (top).

Figure 6:
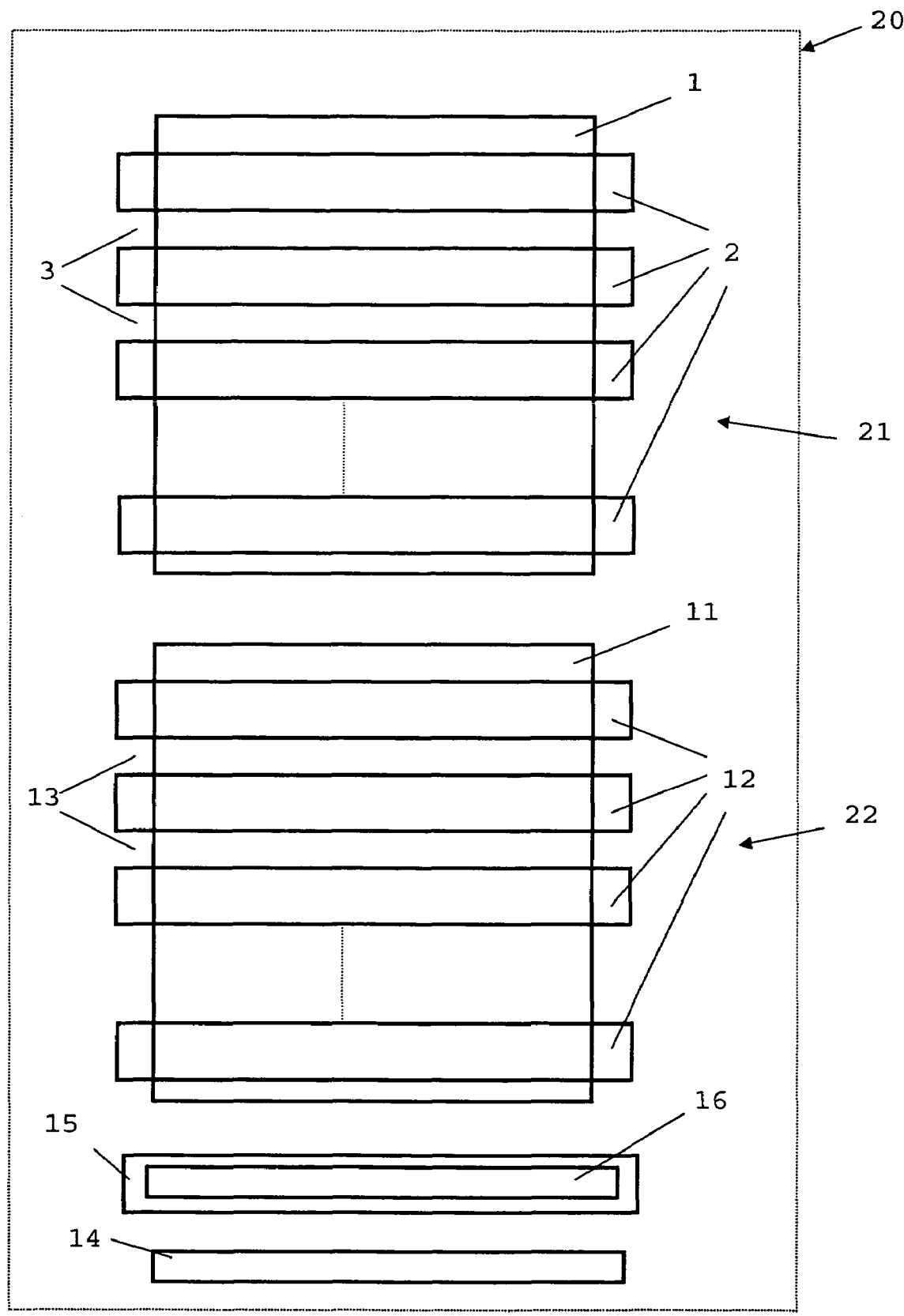
FIG. 6 shows a schematic top view of an example of a high voltage power integrated circuit according to an embodiment of the present invention.

FIG. 6 shows schematically an example of a high voltage power integrated circuit 20 according to an embodiment of the present invention that incorporates two power devices 100, one operating in low side 21 and one in high side 22 (as known per se, for example in half bridge configurations). A CMOS low side driver 14 and a high side driver 16 are also shown. The active areas 1,11, the membranes 2,12, and the regions 3,13 between the membranes 2,12 for the low side and high side devices 21,22 respectively are shown. The CMOS drive circuit 16 which controls the high side power device 22 is placed within a separate membrane 15.

Figure 7:
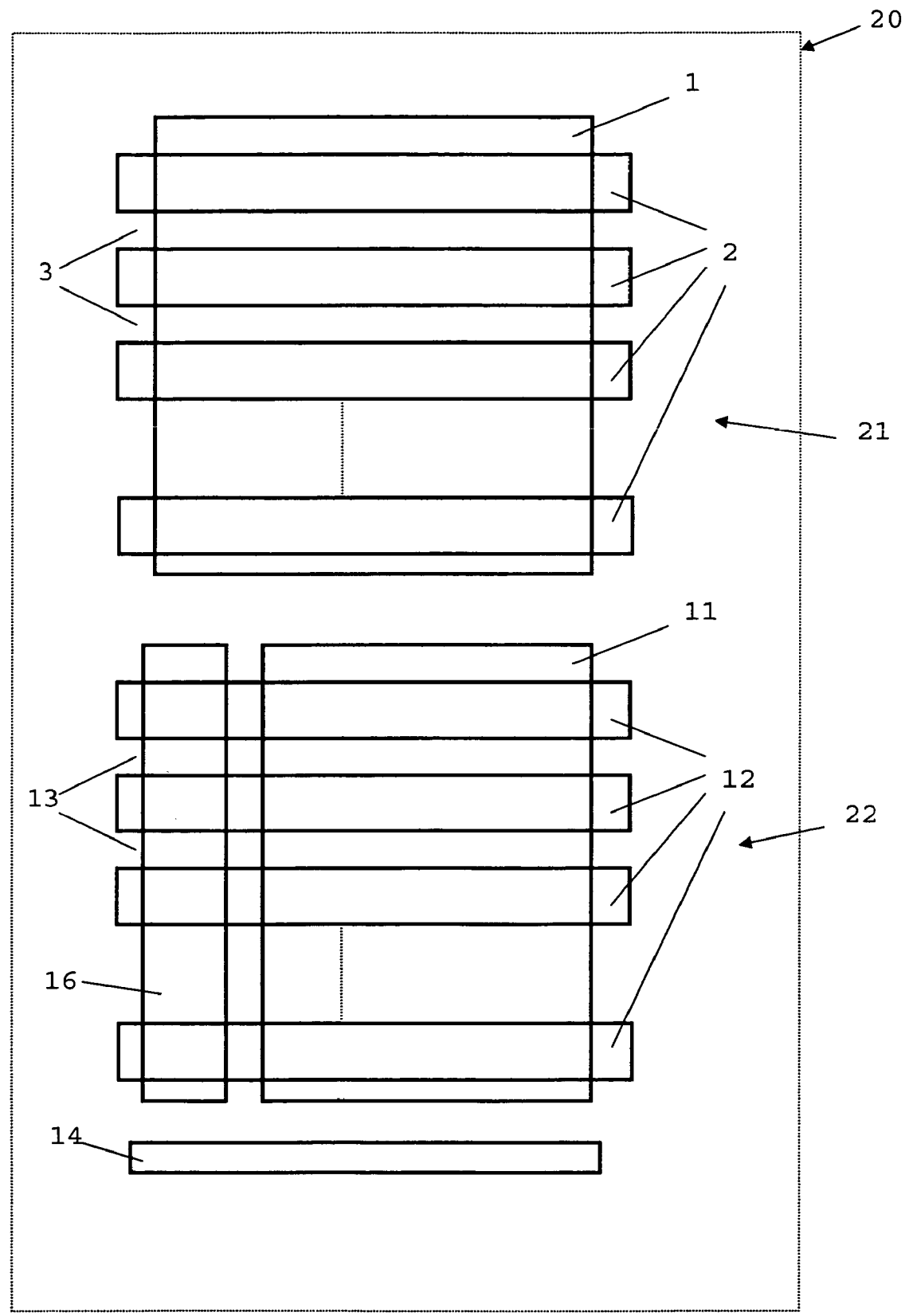
FIG. 7 shows a schematic top view of another example of a high voltage power integrated circuit according to an embodiment of the present invention.

FIG. 7 shows schematically another example of a high voltage power integrated circuit 20 according to an embodiment of the present invention that incorporates two power devices, one operating in low side 21 and one in high side 22 similarly to those shown in FIG. 6. The CMOS low side driver 14 and high side driver 16 are also shown. Compared to the embodiment shown in FIG. 6, in the example of FIG. 7 the CMOS high side drive circuit 16 is placed within at least parts of the multiple membranes 12 in which the active area 11 for the high side device 22 is in part formed. In this case, it is also possible for each cell of the high side power device 22 (i.e. the parts of the high side power device 22 that are respectively placed within one membrane 12) to have its own driver.

In FIGS. 8 to 17 and FIGS. 19 to 21, for simplicity only a half cell and a half membrane are shown. It will be understood that in practice a complete device would be based on several such cells with multiple membranes.

Figure 8:
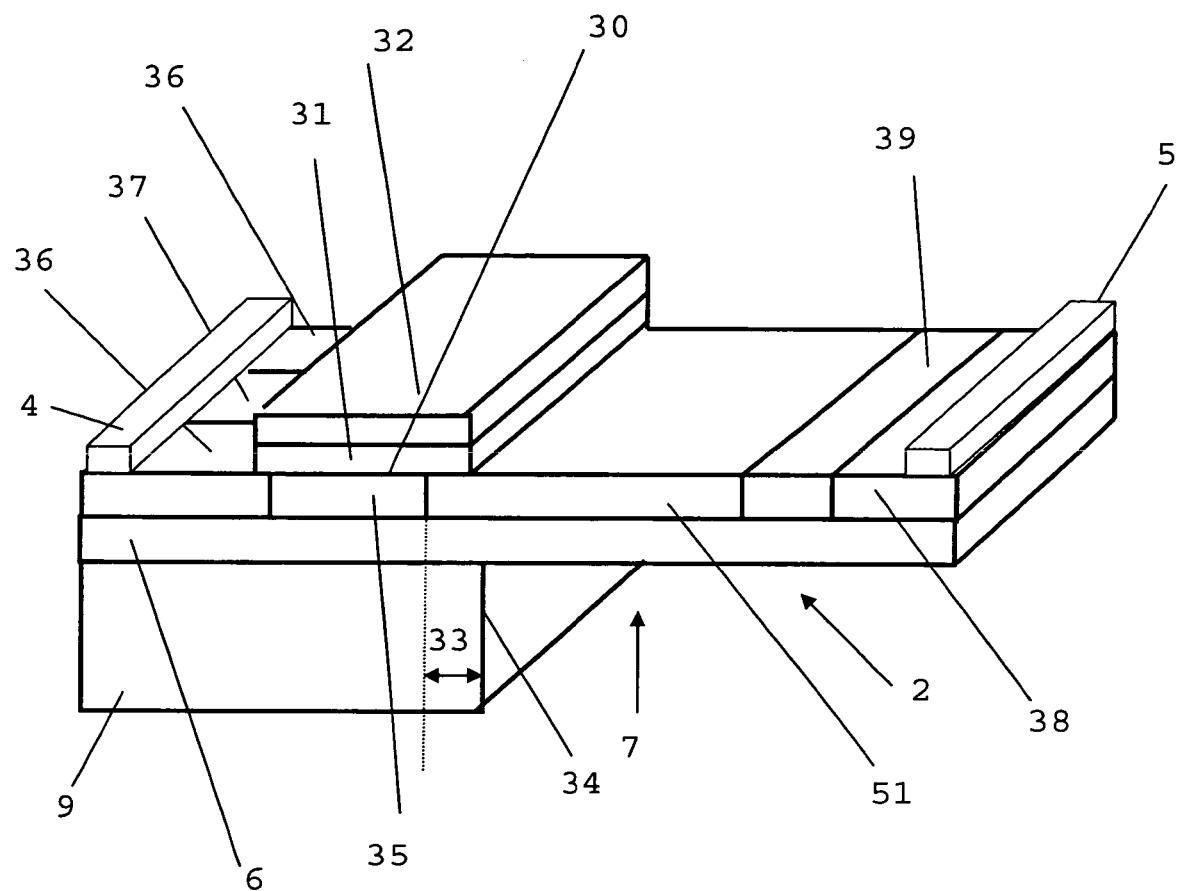
FIG. 8 shows a schematic three dimensional view of a part of an example of a high voltage power device according to an embodiment of the present invention.

Referring now to FIG. 8, the high voltage power device of this example can be used for example as the power device in a single switch power IC or as the low side power device within a multiple switch power IC. The channel 30 and the gate 31,32 are above the substrate 9 while at least part of the drift region 51 and at least part of the high voltage terminal 5 are placed within the membrane 2. A certain distance 33a between the edge of the silicon substrate 9 and the edge of the channel 30 of the drift region 51 is built in so that the channel 30 is placed entirely above the silicon substrate 9 and therefore experiences less heat during operation and less mechanical stress. (It will be understood that whilst the interface or "physical junction" between the drift region 51 and the p-well 35 is above the substrate 9, at least part of the high voltage junction, namely part of the drift region 51, is within the membrane 2.) In this example the device is a punch-through Lateral Insulated Gate Bipolar transistor (LIGBT) having a low voltage terminal 4, a high voltage terminal 5, a buried oxide 6, gaps 7 below the membranes 2, a silicon substrate 9, a surface 30 of the p-well 35 where the channel is formed following the application of an appropriate voltage to the gate, a gate oxide 31, a polysilicon/metal gate terminal 32, an edge 34 of the silicon substrate 9, an n+ cathode (source) terminal 36, a p+ cathode short (p-well contact) 37 and a p+ anode (collector) 38 with an n buffer 39. The buffer 39 is typically added in an IGBT to prevent the punch-through and/or reduce the injection efficiency.

As an example, a power device according to the present invention can support voltages from 30V to 1.2 kV with maximum current densities of tens of amps/cm$^2$. Such a device can in principle operate at higher frequencies than comparable known devices. The exact frequency level depends on several factors, such as the type of the device employed (bipolar, unipolar or super-junction), the application selected (switch mode power supply, lighting, motor control) and the output power (e.g. 3 W to 500 W). For a lateral insulated gate bipolar transistor for a typical 600-700 V breakdown in switch mode power supplies applications, operating frequencies from 50 KHz to 1-2 MHz can be achieved. The device features very low parasitic capacitances due to the absence of the silicon substrate underneath the high voltage terminal. The width of the membranes 2 (see for example FIG. 1) can be in the range of 10-200 µm or so with a typical value of 100 µm or so (for a 600V device). The length of the membranes 2 can vary from a couple of hundred of microns to a couple of millimetres or so. The membrane thickness can vary from 0.1 µm to a few tens of microns or so. The space between the multiple membranes can vary from a few microns to a few hundred of microns or so. A typical value is around 50 microns. The distance 33a is in the range of few microns or so while the drift region 51 length varies with the breakdown voltage but it is typically 30 to 40 µm or so for a 600V device. The semiconductor substrate is usually a few hundred of micrometers thick (e.g. 300 µm or so). The other dimensions are similar to those known in the state-of-the-art power ICs.

Figure 9:
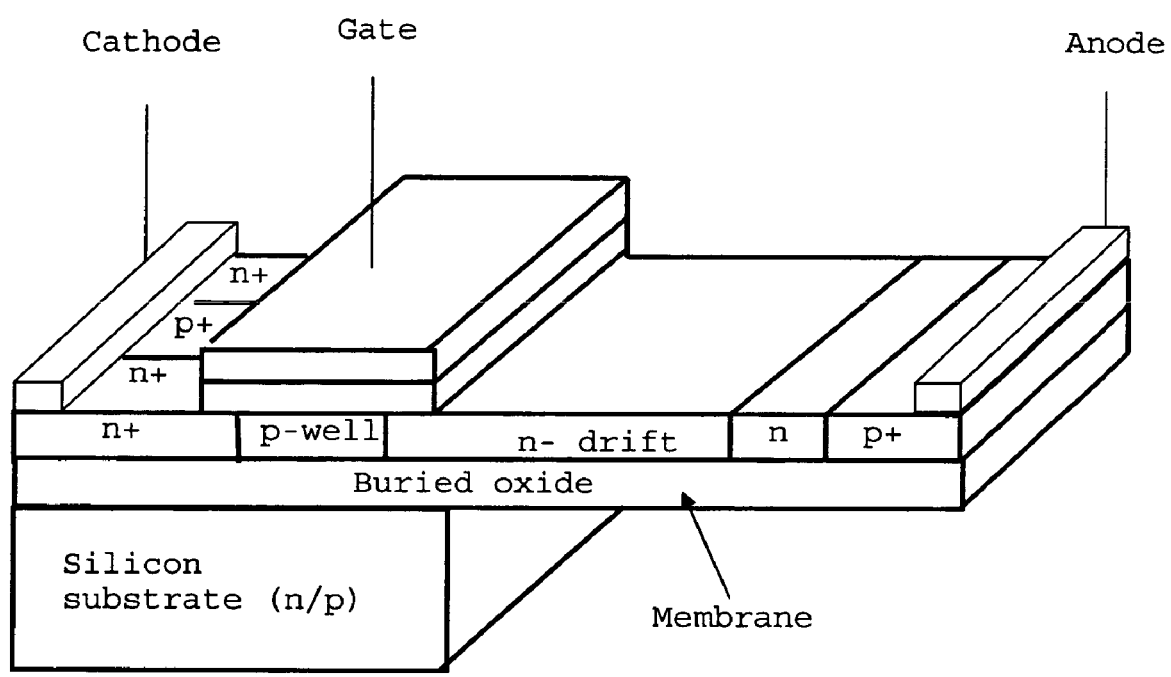
FIG. 9 shows schematically the device of FIG. 8 using the standard notations for different layers.

FIG. 9 shows schematically the Lateral Insulated Gate Bipolar transistor (LIGBT) of FIG. 8 using the standard notations for different layers. The doping charge in the n-drift layer is relatively low and certainly considerably lower than in typical RESURF Junction-Isolation or SOI structures. This charge is adjusted so that a uniform (or as "uniform" as possible) electric field distribution is achieved in the n-drift layer. An optimal doping charge in the n-drift layer is between $10^{11}$ cm$^{-2}$ to $8\times10^{11}$ cm$^{-2}$ for a high voltage device with breakdown capability in excess of 300 V. The n-buffer prevents the depletion region reaching the p+ anode and therefore avoids a premature punch-through type breakdown. The n-buffer may also serve to adjust the injection efficiency of the anode junction.

During the turn-on of this device an appropriate potential is applied to the gate, allowing electrons to be transported from the source via the inversion channel formed in the p-well, into the n-drift base, which triggers the injection of holes from the anode junction, p+/n− buffer into the n-drift region. At high current densities, in the on-state, the amount of electrons and holes accumulated in the n-drift region, termed "plasma", exceeds the doping charge by a few orders of magnitude, leading to conductivity modulation thereby reducing the on-state resistance of the device.

The device turns off by removing the potential applied to the gate, which results in the removal of the channel and consequently removal of the electron current through the channel. The device does not turn-off instantaneously as it is limited by the time removal of its plasma and charging of its parasitic capacitances. The anode/substrate capacitance is virtually negligible so the output capacitance is very low. The device therefore experiences a fast growth of the anode voltage. The speed of removing the plasma depends on the lifetime, the anode junction efficiency, and the thickness and length of the drift layer. By carefully engineering these factors as known to those skilled in this art, a fast device can be obtained.

The structure shown in FIG. 9 is based on a thin silicon layer, but a thicker layer is also possible in which case not all the junctions reach the buried oxide.

Figure 10:
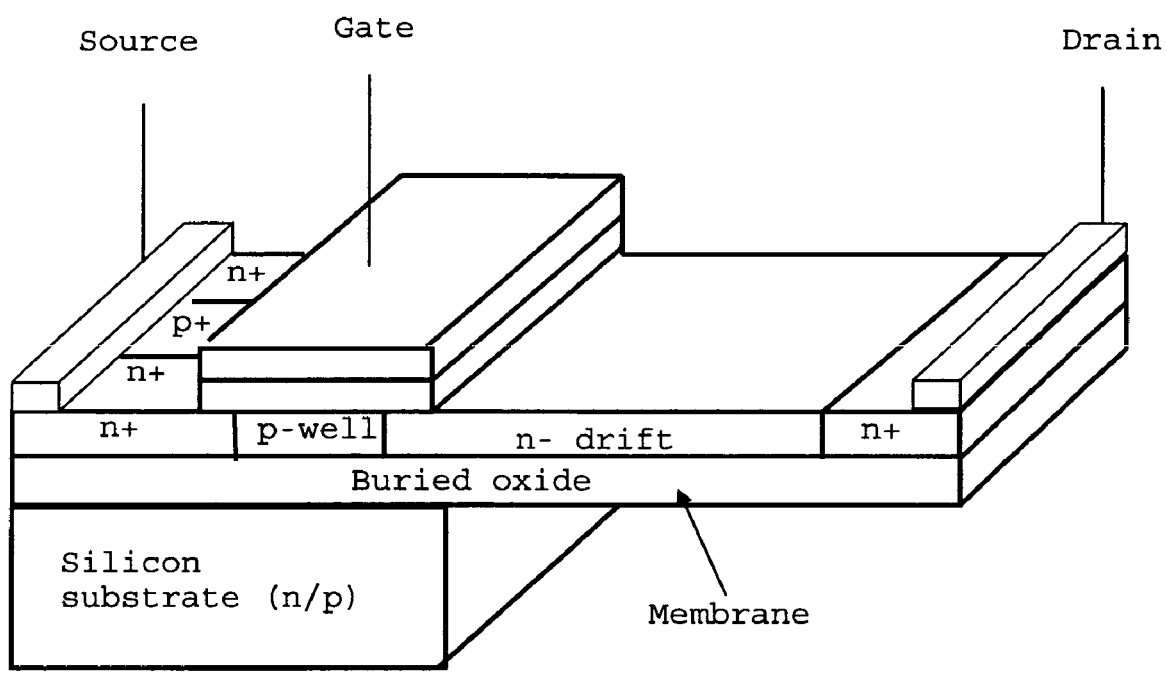
FIG. 10 shows schematically an example of an LDMOSFET structure according to an embodiment of the present invention.

FIG. 10 shows schematically an example of a LDMOSFET structure according to an embodiment of the present invention. When compared to the LIGBT shown in FIG. 9, the device has the anode junction replaced by a n+ contact region to the drift layer. The device shown in FIG. 10 is therefore unipolar and as a result does not encounter conductivity modulation in the on-state. Unlike the LIGBT shown in FIG. 9, the on-state resistance in the LDMOSFET is dictated by the doping charge in the n– drift layer. A higher doping charge would result in a more efficient device. Unfortunately this charge is set by the breakdown condition for an optimal distribution of the electric field and therefore it is expected that such a device would have a high on-state resistance as the doping concentration needs to be relatively low to allow a relatively fast growth of the depletion region in the breakdown blocking mode.

Figure 11:
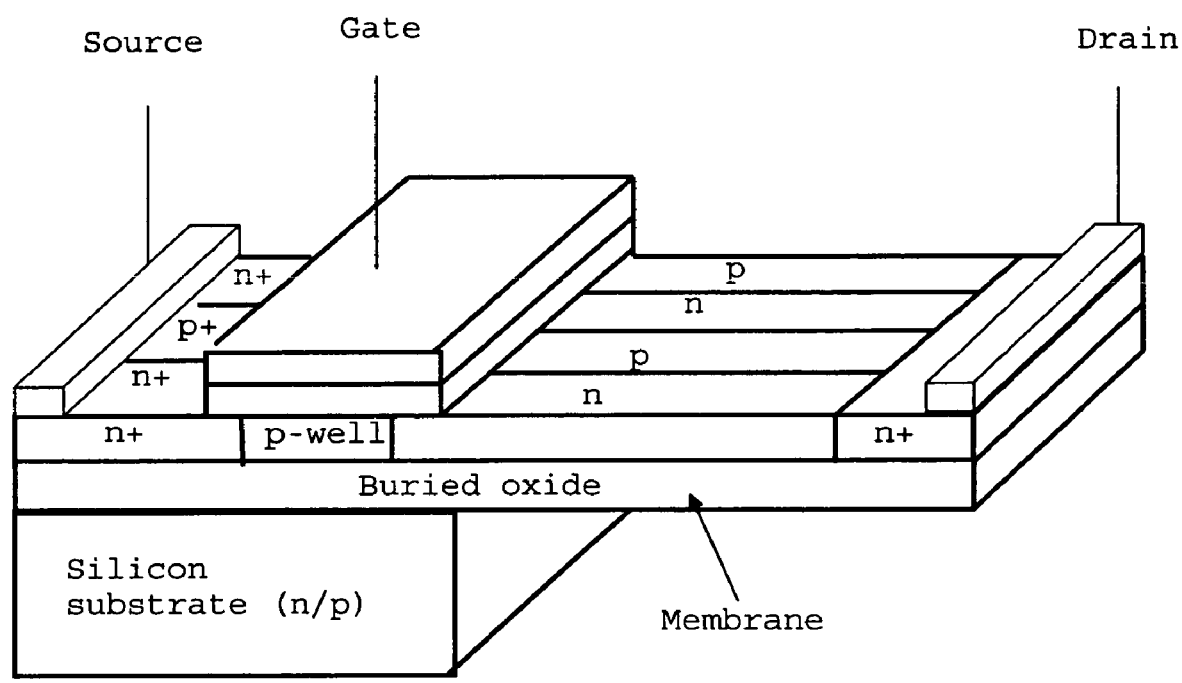
FIG. 11 shows schematically an example of a superjunction or 3D RESURF LDMOSFET according to an embodiment of the present invention.

FIG. 11 shows schematically an example of a superjunction or 3D RESURF LDMOSFET according to an embodiment of the present invention which addresses the drawback of a high on-state resistance of the LDMOSFET shown in FIG. 9. The n– drift layer is replaced by alternate stripes of n-drift and p-drift layers displaced in the third dimension on the membrane. The device operates on the charge compensation concept which allows the doping charge in the n– drift stripes to be significantly higher (e.g. by an order of magnitude) than that of an equivalent n-drift region in a LDMOSFET. The doping charge in the n-drift layer is approximately the same as the doping charge in the p-drift layer. The structure depletes fast in the third dimension due to the existence of the multiple n/p junctions. Well before the actual breakdown occurs, the n/p drift regions are completely depleted. The structure has significant advantages in terms of high speed and low on-state resistance, thus offering a competitive alternative to the LIGBT shown in FIG. 9.

Figure 12:
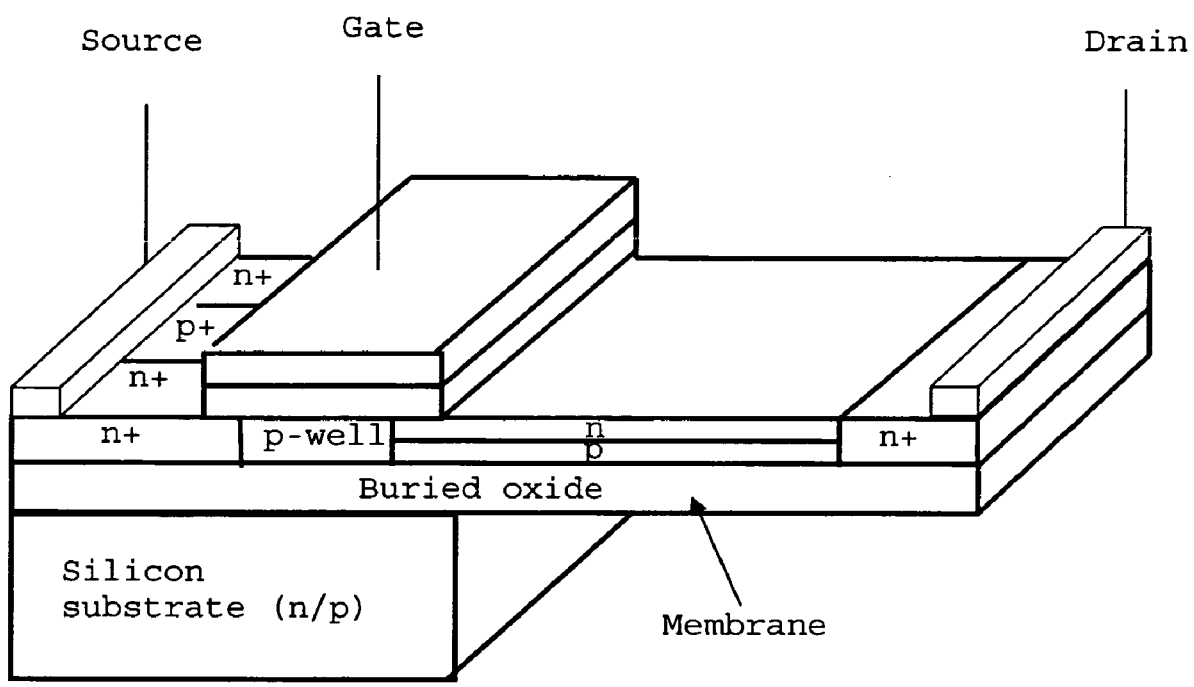
FIG. 12 shows schematically another example of a superjunction or 3D RESURF LDMOSFET according to an embodiment of the present invention.

FIG. 12 shows schematically an example of an alternative superjunction type LDMOSFET whereby two n/p drift layers are displaced vertically within a membrane.

Figure 13:
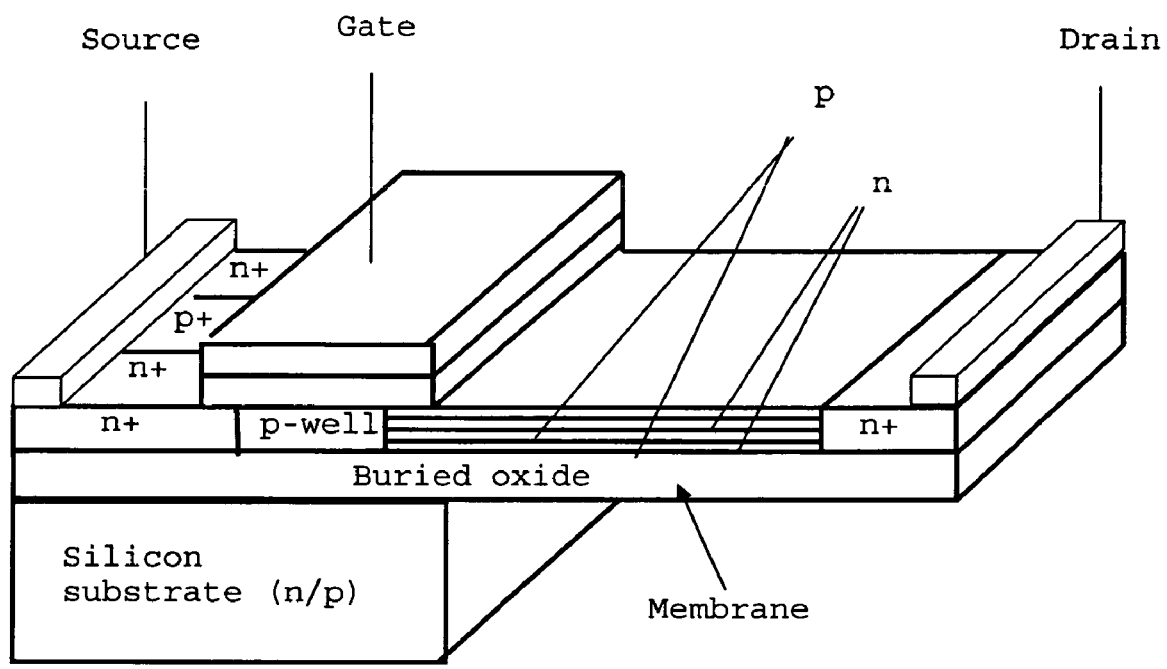
FIG. 13 shows schematically another example of a superjunction or 3D RESURF LDMOSFET according to an embodiment of the present invention.

FIG. 13 shows an alternative superjunction type LDMOSFET where multiple n/p drift layers are placed vertically within a membrane.

Figure 14:
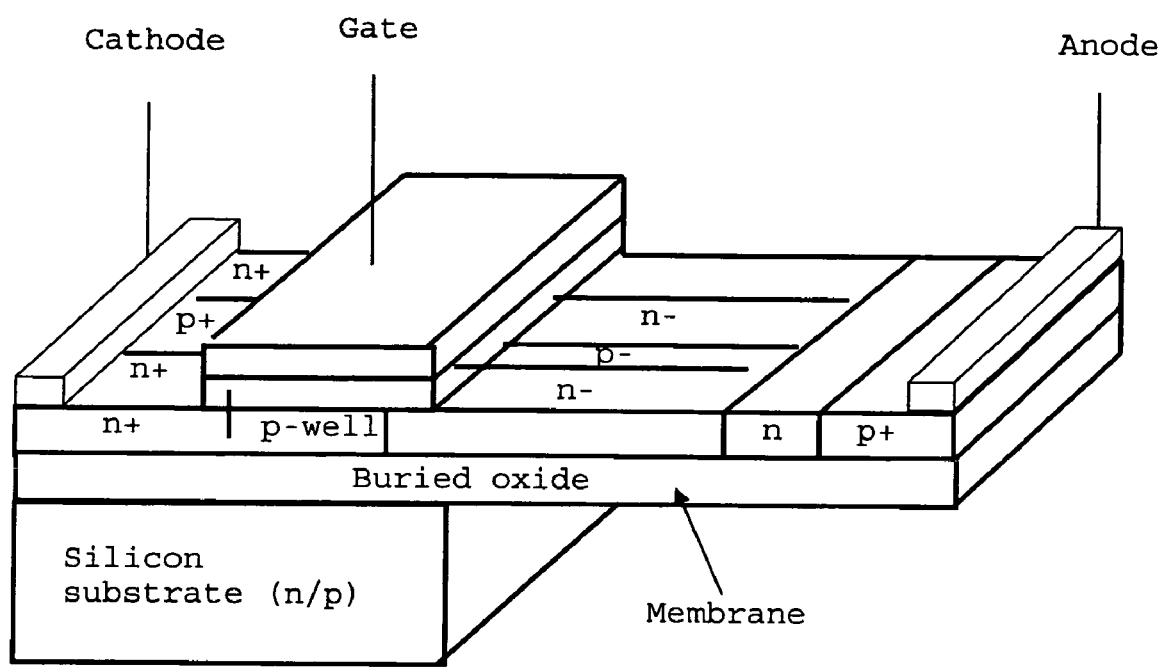
FIG. 14 shows schematically an example of an LIGBT using the 3D RESURF (superjunction) concept according to an embodiment of the present invention.

FIG. 14 shows schematically an example of an LIGBT using the 3D RESURF (superjunction) concept according to an embodiment of the present invention. The n-drift/p-drift stripes can have a lower doping than those in the 3D RESURF (superjunction) LDMOSFET shown in FIG. 11. This is because the doping of the drift region in the LIGBT does not influence the on-state resistance (as is the case in LDMOSFETs), thus on the one hand relaxing the need of very tight doping control and on the other hand allowing lower levels of impurity doping. The structure shown in this figure has advantages in terms of speed due to slightly lower levels of plasma (for the same current densities) when compared to the LIGBT shown in FIG. 9, and faster depletion growth due to the presence of multiple n-drift/p-drift junctions. The device can also theoretically offer an increase in the breakdown voltage as the growth of the depletion region is facilitated by the presence of the multiple n-drift/p-drift junctions.

Figure 15:
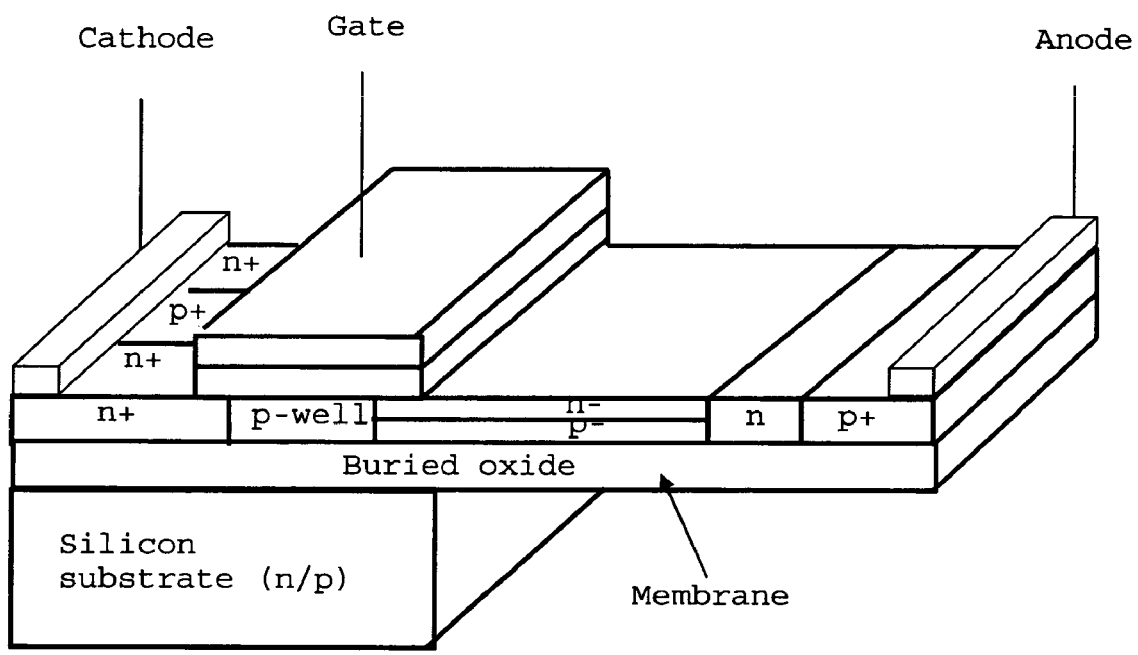
FIG. 15 shows schematically another example of a superjunction type LIGBT according to an embodiment of the present invention.

FIG. 15 shows schematically an example of an alternative superjunction type LIGBT in which two n/p drift layers are displaced vertically within a membrane.

Figure 16:
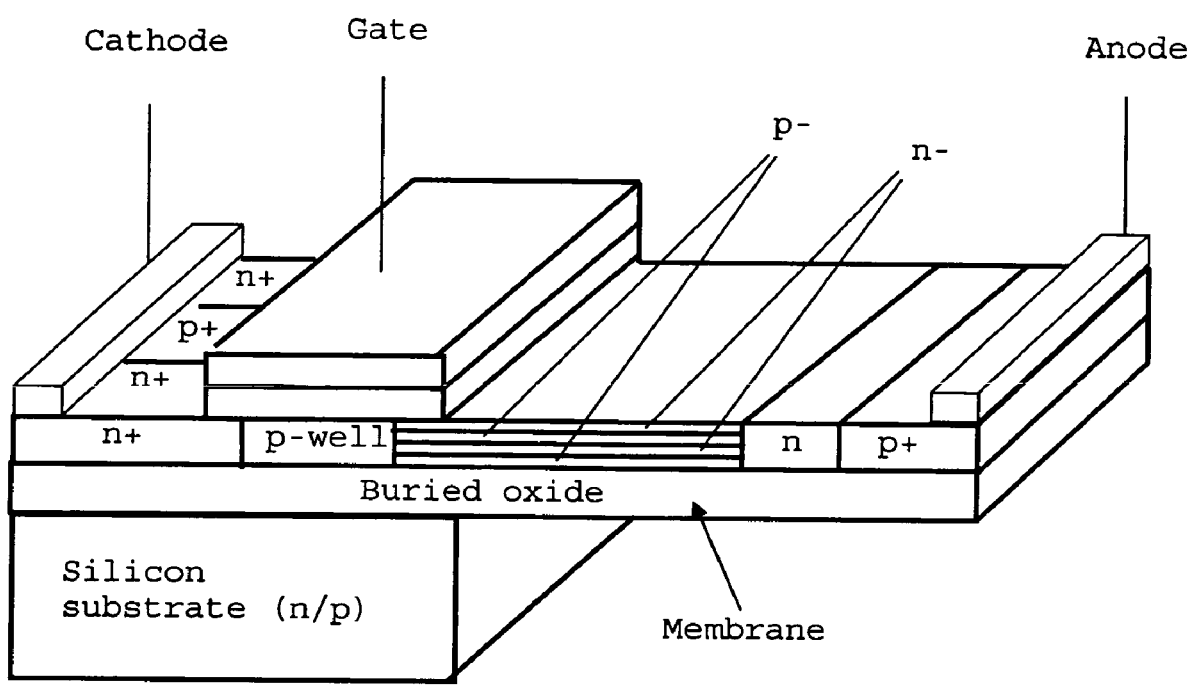
FIG. 16 shows schematically another example of a superjunction type LIGBT according to an embodiment of the present invention.

FIG. 16 shows schematically an example of an alternative superjunction type LIGBT in which multiple n/p drift layers are placed vertically within a membrane.

Figure 17:
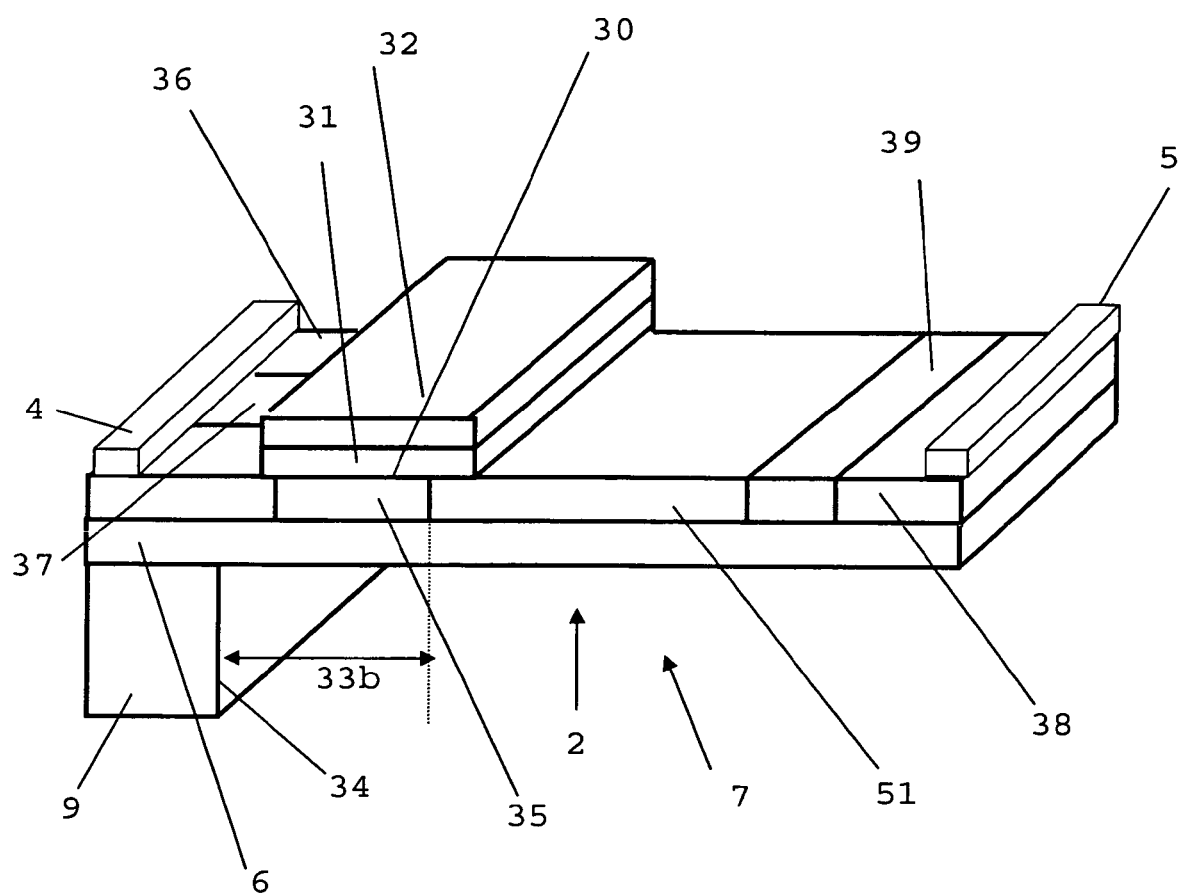
FIG. 17 shows schematically a three dimensional view of a part of another example of a high voltage power device according to the present invention.

FIG. 17 shows a schematic three dimensional view of a part of an example of a high voltage power device according to an embodiment of the present invention operating in the high side of a double or multiple switch power IC. The channel 30 and the gate 31,32 are placed within the membrane 2. A certain distance 33b between the edge of the silicon substrate 9 and the edge of the drift region 51 is built in to allow for a large potential drop within the gap 7 underneath the membrane 2. This is necessary when the high side device operates with the source at an elevated potential with respect to the substrate 9, which is normally connected to ground or the source of the low side power device (not shown). In this example the device is a punch-through Lateral Insulated Gate Bipolar transistor (LIGBT) having a low voltage terminal 4, a high voltage terminal 5, a buried oxide 6, a membrane 2, a silicon substrate 9, a surface 30 of the p-well 35 where the channel is formed following the application of an appropriate voltage to the gate, a gate oxide 31, a polysilicon/metal gate terminal 32, an edge 34 of the silicon substrate 9, an n-drift region 51, an n+ cathode (source) terminal 36, a p+ cathode short (p-well contact) 37 and a p+ anode (collector) 38.

Figure 18A:
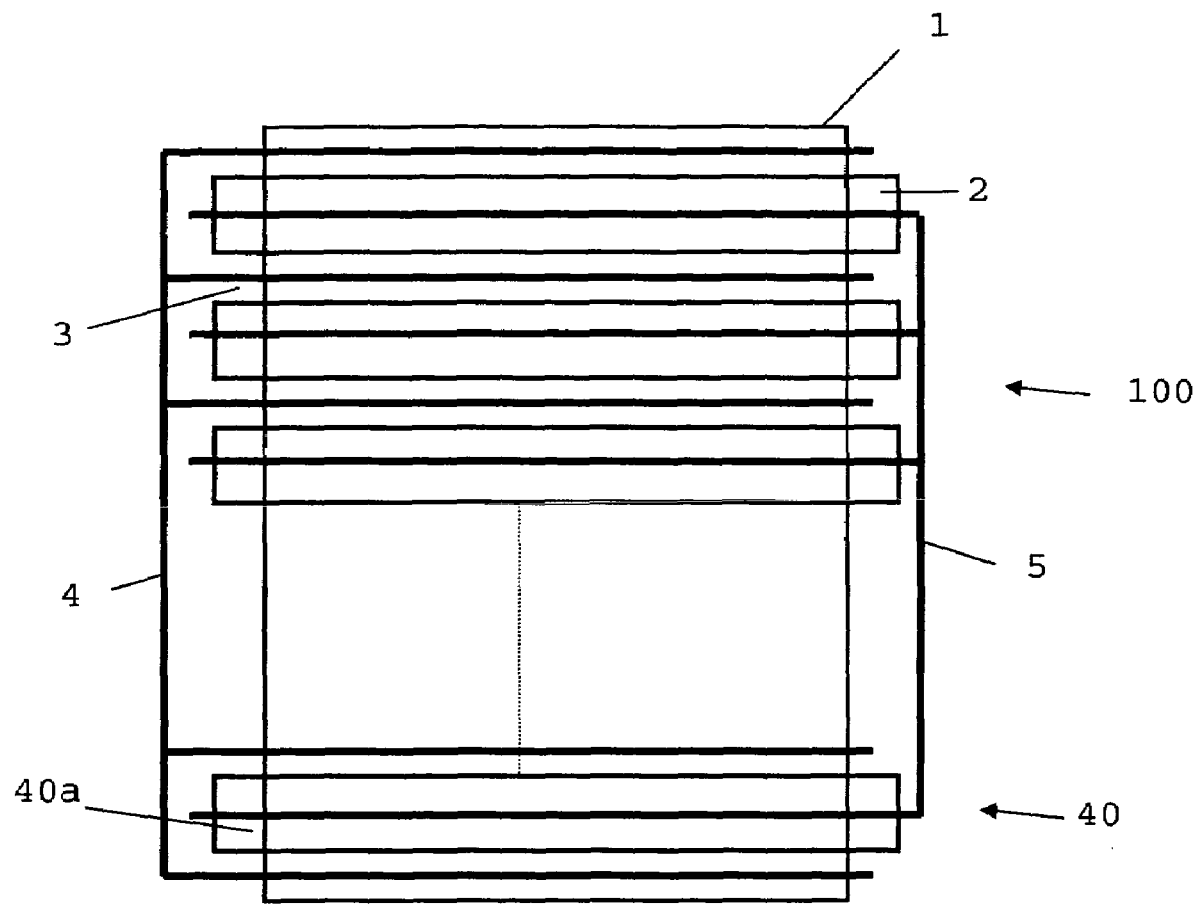
FIG. 18A shows schematically a top view of part of an example of a power IC according to an embodiment of the present invention.
Figure 18B:
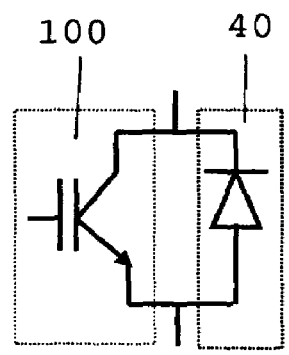
FIG. 18B shows the corresponding circuit diagram.

FIG. 18A shows schematically a top view of part of an example of a power IC according to an embodiment of the present invention which contains a high voltage power switch 100 (e.g. a lateral insulated gate bipolar transistor switch) connected monolithically to an anti-parallel diode 40. The corresponding circuit diagram is shown in FIG. 18B. Shown is the active area 1 of the high voltage power switch 100, the multiple membranes 2, the spaces 3 between membranes 2, the low voltage terminal 4, the high voltage terminal 5 and the active area 40a of the anti-parallel diode 40. For simplicity, the gate terminal of the switch 100 is not shown.

The anti-parallel diode 40 may be placed within at least one (or part of at least one) of the membranes 2. The anti-parallel diode 40 may use the same low voltage and high voltage terminals 4,5 as the power switch 100. The gate terminal will only control the high voltage power switch 100 and will play no role other than a field plate for the anti-parallel diode 40.

Figure 19:
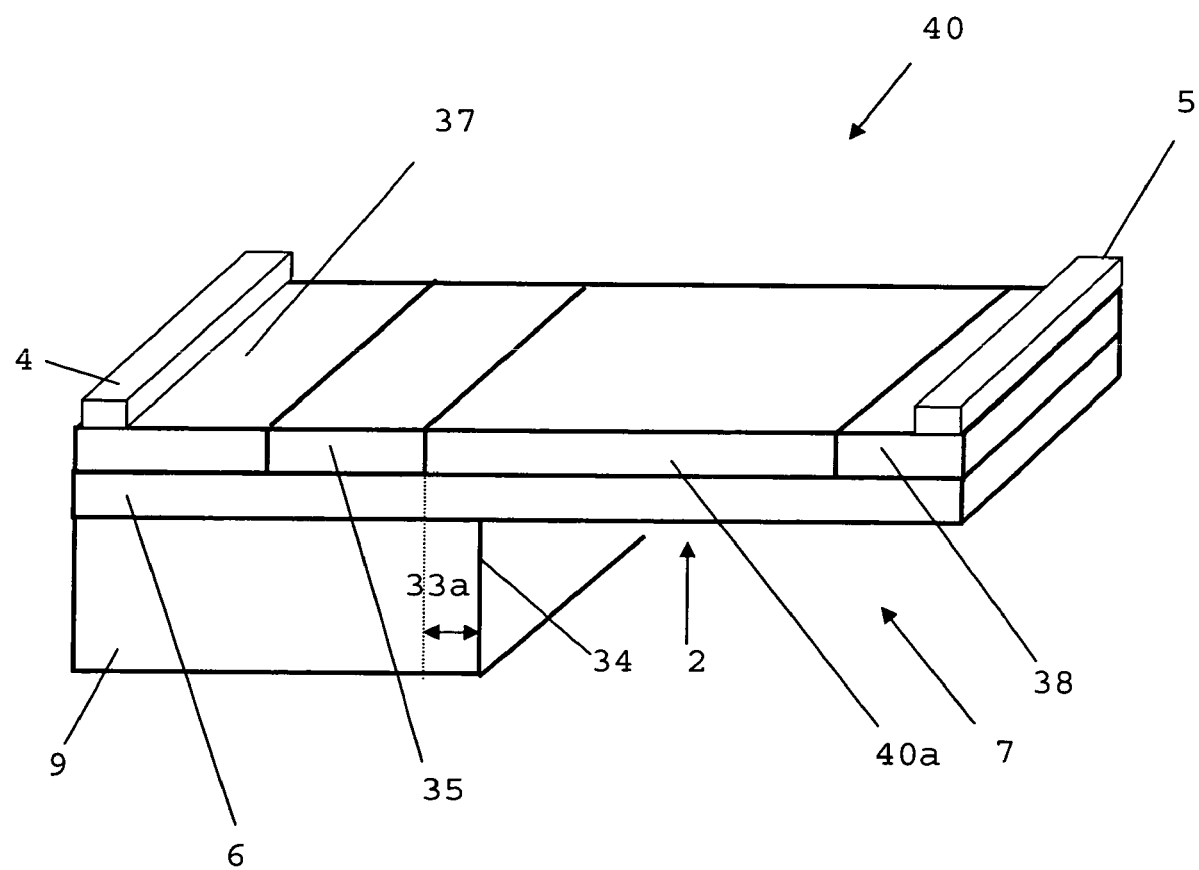
FIG. 19 shows a schematic three dimensional view of a part of an example of a high voltage anti-parallel diode according to an embodiment of the present invention.

FIG. 19 shows schematically a part of an example of a high voltage anti-parallel diode 40 according to an embodiment of the present invention. At least part of the lowly doped region 40a of the diode (drift region) is placed within the membrane 2. In this figure there is shown a low voltage terminal 4, a high voltage terminal 5, a buried oxide 6, a silicon substrate 9, the distance 33a between the edge of the drift region 40a and the edge 34 of the silicon substrate 9, a p-well 35, a p+ anode 37 and an n+ cathode 38.

Figure 20:
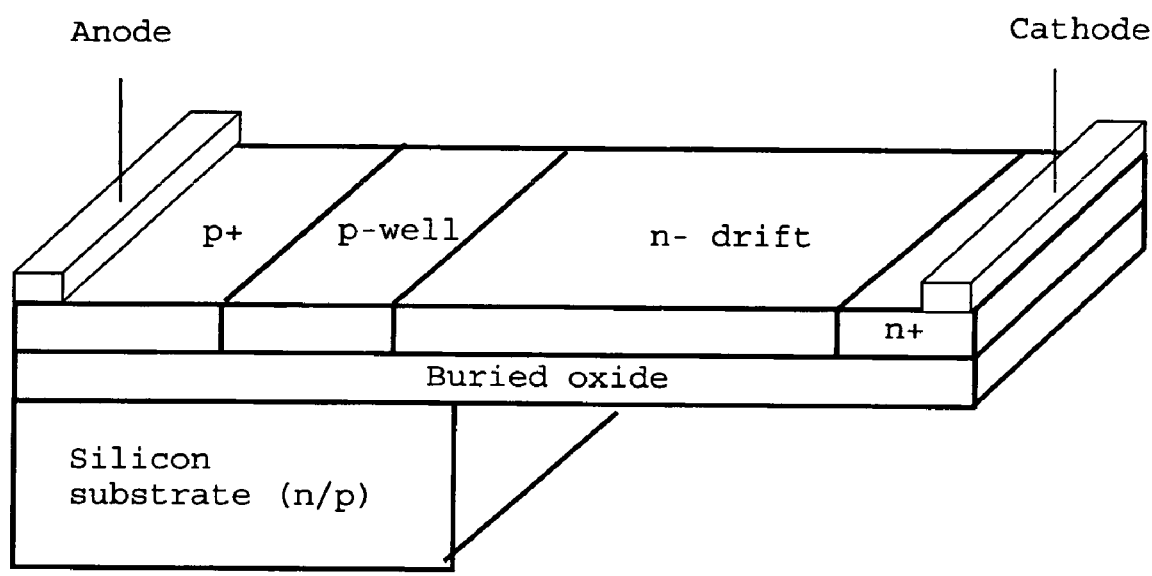
FIG. 20 shows schematically the diode of FIG. 19 using the standard notations for different layers.

FIG. 20 shows schematically the diode of FIG. 19 using the standard notations for different layers.

Figure 21:
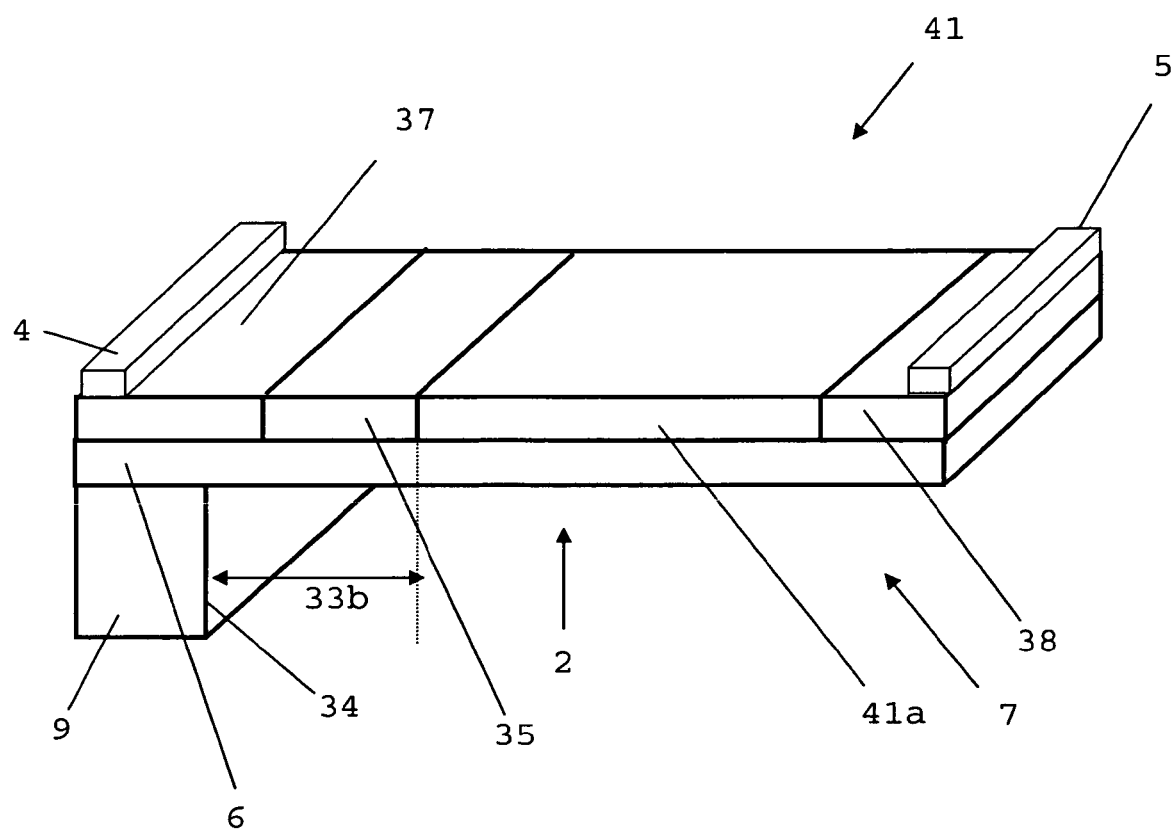
FIG. 21 shows a schematic three-dimensional view of a part of another example of a high voltage anti-parallel diode according to an embodiment of the present invention.

FIG. 21 shows schematically a part of an example of a high voltage anti-parallel diode 41 operating in the high side according to an embodiment of the present invention. At least part of the lowly doped region 41a of the diode (drift region) 41 is placed within the membrane 2. A certain distance 33b between the edge 34 of the silicon substrate 9 and the edge of the drift region 41a is built in to allow for a large potential drop within the gap 7 underneath the membrane 2. This is necessary when the high side diode 41 operates with the low voltage terminal at an elevated potential with respect to the substrate 9, which is normally connected to ground (not shown). In this figure there is shown a low voltage terminal 4, a high voltage terminal 5, a buried oxide 6, a silicon substrate 9, a distance 33b between the edge 34 of the silicon substrate leg 9 and the edge of the drift region 41a, a p-well 35, a p+ anode 37 and an n+ cathode 38.

Figure 22:
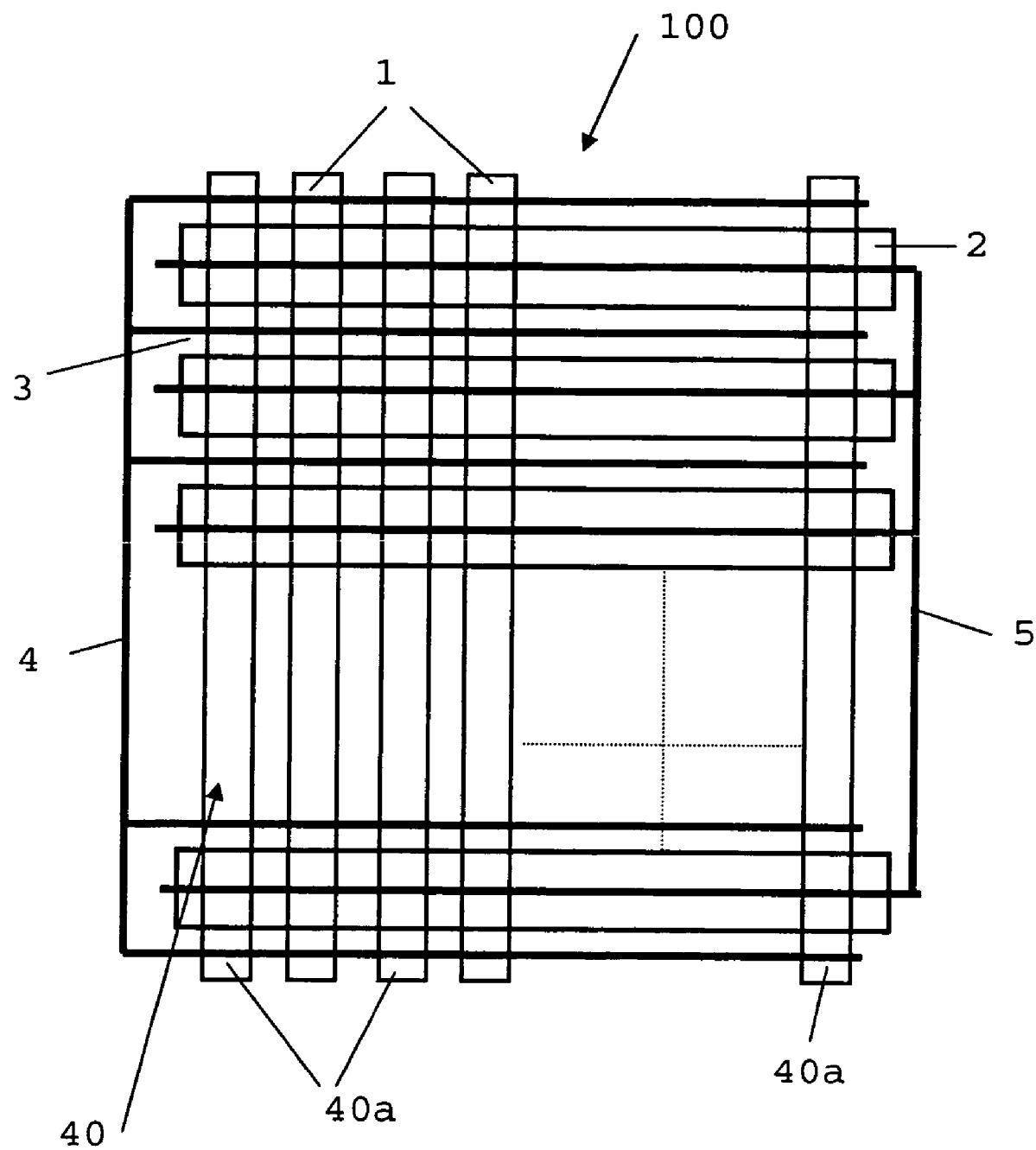
FIG. 22 shows schematically a top view of part of another example of a power IC according to an embodiment of the present invention.

FIG. 22 shows schematically part of an example of a power IC according to an embodiment of the present invention that contains a high voltage power device 100 made of several parallel active regions 1 connected monolithically and intercalated to several active regions 40a of an anti-parallel diode 40. The alternate active regions 1,40a of the power device 100 and the anti-parallel diode 40 are placed over (and within) the multiple membranes 2. In this figure are shown the active regions 1 of the power switch 100 (e.g. an insulated gate bipolar transistor), the multiple membranes 2, the spaces 3 between the membranes 2, a low voltage terminal 4, and a high voltage terminal 5, and the active area 40a of the anti-parallel diode 40.

Figure 23:
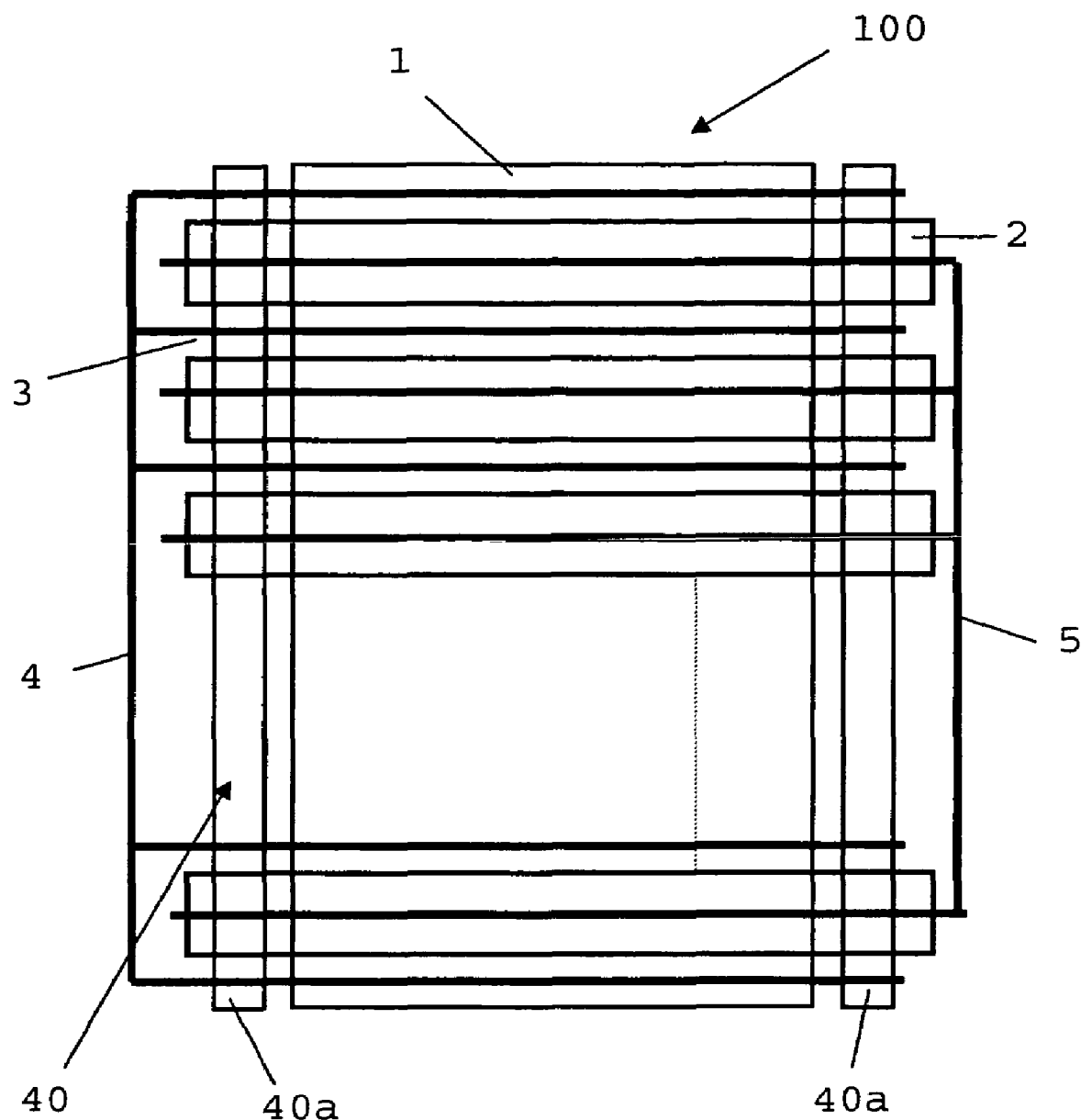
FIG. 23 shows schematically a top view of part of another example of a power IC according to an embodiment of the present invention.

FIG. 23 shows schematically a variation of the structure shown in FIG. 22. In this example, there is shown part of a power IC that contains a high voltage power switch 100 connected monolithically to two active regions 40a of an anti-parallel diode 40 placed at the edge of the power switch 100. The active area 1 of the power device 100 and the active regions 40a of the anti-parallel diode 40 are placed over (and within) the multiple membranes 2. The diode active regions 40a placed at the edge may have higher breakdown than the power switch 100 provided that the switch 100 is a bipolar device. This therefore helps to reduce the effect or indeed suppress the edge breakdown characteristic of power devices.

Figure 24:
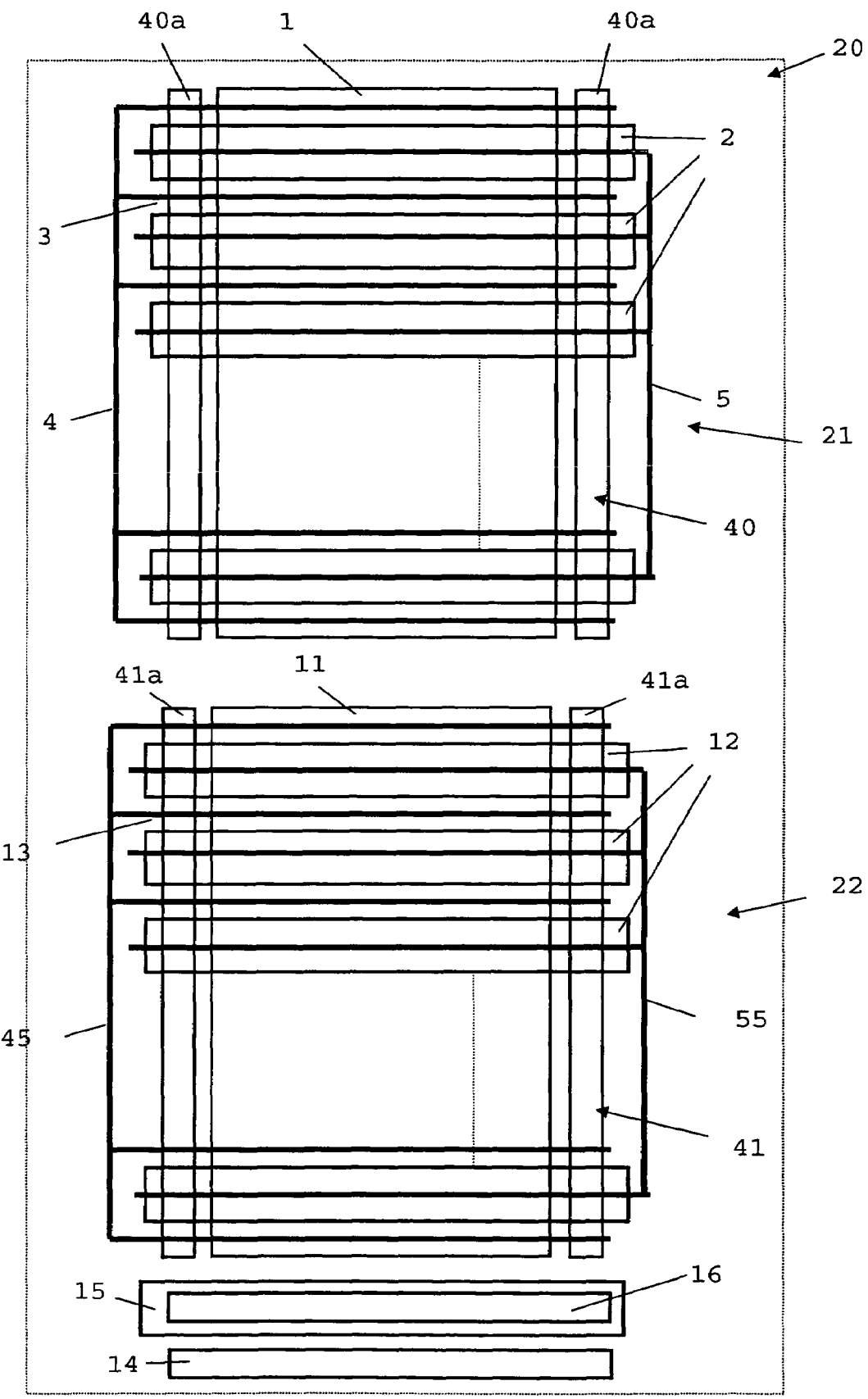
FIG. 24 shows schematically a top view of part of another example of a power IC according to an embodiment of the present invention.

FIG. 24 shows schematically an example of a high voltage power integrated circuit 20 according to an embodiment of the present invention that incorporates two power switches, one operating in low side 21 and one in high side 22 (as known for example in a half bridge configuration) and two anti-parallel diodes 40,41, one for each switch 21,22. The diodes 40,41 are connected such that their active areas 40a,41a are placed at the edge of the respective power switches 21,22. The CMOS low side driver 14 and the high side driver 16 are also shown. Also shown are the active areas 1,11 for the low side and high side power switches 21,22 respectively, the membranes 2,12 for the low side and high side devices 21,22 respectively, and the spaces 3,13 between the membranes 2,12 for the low side and high side devices 21,22 respectively. The CMOS drive circuit 16 which controls the high side power device 22 is placed within a separate membrane 15. Also shown are the low voltage and high voltage terminals 4,5 for the low side device 21 and corresponding anti-parallel diode 40, and the low voltage and high voltage terminals 45,55 for the high side device 22 and corresponding anti-parallel diode 41.

Figure 25:
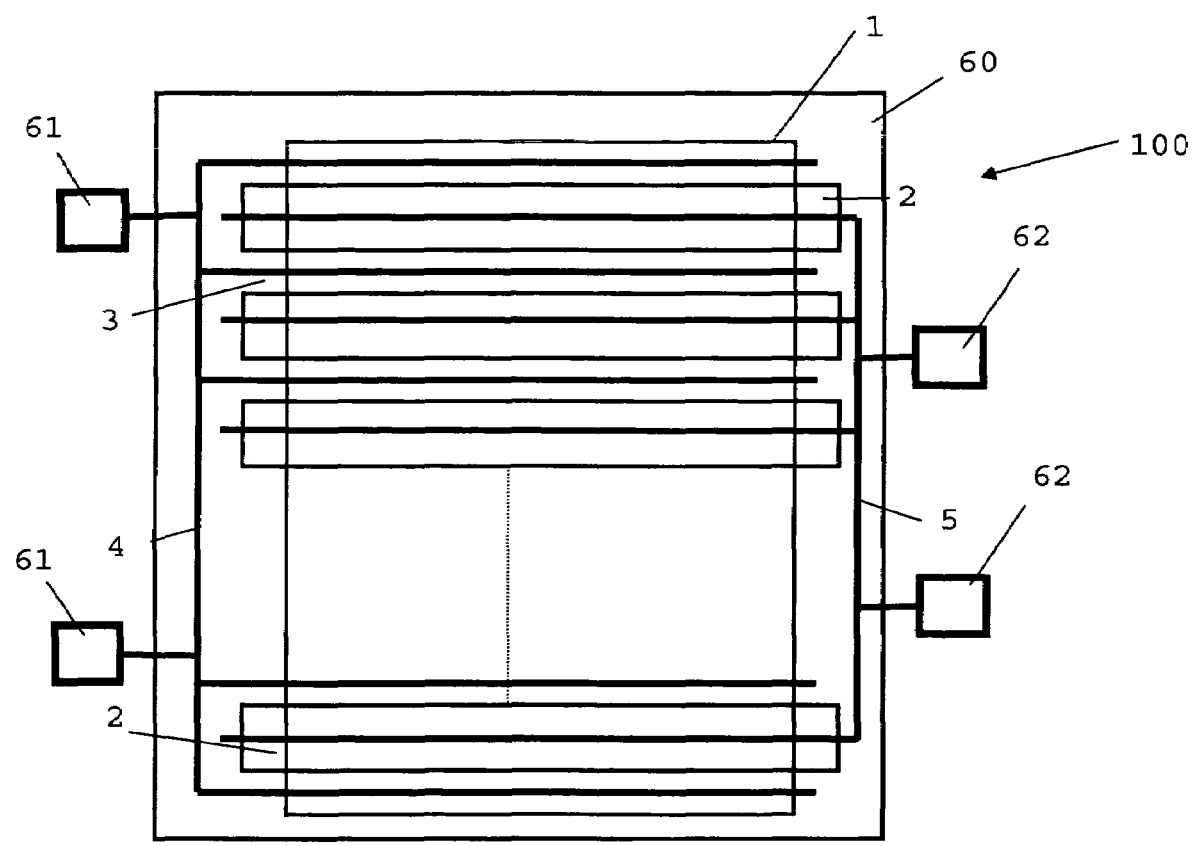
FIG. 25 shows a schematic top view of the device shown in FIG. 2 where a glass or semiconductor cap is fitted.
Figure 26:
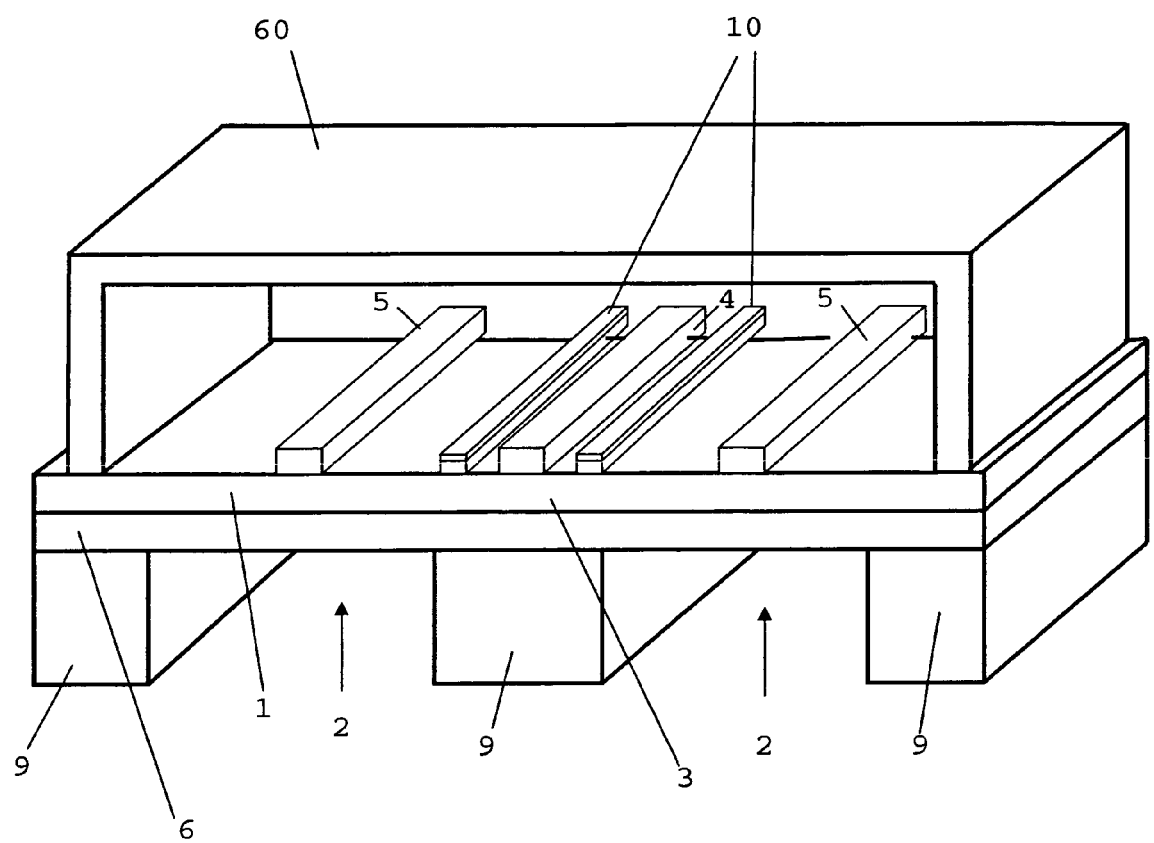
FIG. 26 shows schematically a top three-dimensional view of an example of a power device according to an embodiment of the present invention featuring a protective cap.

FIGS. 25 and 26 show schematically the device 100 shown in FIG. 2 where a glass or semiconductor cap 60 is added on top of the power device 100 at a certain distance from the surface of the power device 100, to protect it during packaging and/or dicing as well as during operation. Low voltage pads 61 and high voltage pads 62 are placed outside the cap 60 so that wire bonding (or other means of contacting the power IC within the package) is still possible. In FIG. 26, for clarity only two membranes 2 and only some of the layers are shown.

FIG. 27 shows schematically the device 100 shown in FIG. 5 in which a conformal layer 63 is added to the back of the membrane(s) 2. The conformal layer 63 is deposited on the back after the membrane 2 is formed. Its role is to increase the overall mechanical resistance and possibly help to prevent air breakdown and/or reduces the effect of parasitic charge contamination. The conformal layer 63 may be for example a nitride, an oxide, a glass, an organic material, such as a polymer or polyamide, or a combination thereof.

FIG. 28 shows a shows schematically the device 100 shown in FIG. 5 in which a dielectric layer 64 is added to the back of the membrane(s) 2 and fills the entire trench or cavity under the membrane 2. The role of this layer 64 is to increase the overall mechanical resistance and electrically passivate the back surface (against mobile charge). The dielectric layer 64 may be for example a nitride, an oxide, a glass, an organic material, such as a polymer or polyamide, or a combination thereof.

Embodiments of the present invention have been described with particular reference to the examples illustrated. However, it will be appreciated that variations and modifications may be made to the examples described within the scope of the present invention.

The invention claimed is:

1. A high voltage/power semiconductor device, the device comprising:
   at least one active region having a plurality of high voltage junctions electrically connected in parallel, at least part of each of said high voltage junctions being located in or on a respective membrane such that the active region is provided at least in part over plural membranes, there being non-membrane regions between said membranes;
   a single low voltage terminal for connection to plural of said high voltage junctions; and,
   a single high voltage terminal for connection to plural of said high voltage junctions;
   at least a portion of the low voltage terminal and at least a portion of the high voltage terminal being connected directly or indirectly to a respective one of the high voltage junctions, at least those portions of the high voltage terminal that are in direct or indirect contact with one of the high voltage junctions being located on or in a respective one of the plural membranes.

2. A device according to claim 1, wherein at least one of those portions of the low voltage terminal that are in direct or indirect contact with one of the high voltage junctions is located on or in a non-membrane region.

3. A device according to claim 2, wherein all of those portions of the low voltage terminal that are in direct or indirect contact with one of the high voltage junctions are located on or in a non-membrane region.

4. A device according to claim 1, wherein the high voltage terminal and the low voltage terminal have an interdigitated structure.

5. A device according to claim 1, comprising a control terminal located adjacent the low voltage terminal.

6. A device according to claim 1, wherein at least one edge of at least one of the membranes is at least partly protected by a top field plate.

7. A device according to claim 1, comprising an insulating layer over the top of the device.

8. A device according to claim 7, where the insulating layer is an organic material.

9. A device according to claim 1, comprising a conformal layer made of an insulating material on the bottom of at least one of the membranes.

10. A device according to claim 9, where the conformal layer is a nitride, an oxide, a glass, an organic material or a combination thereof.

11. A device according to claim 1, comprising a dielectric layer made of an insulating material on the bottom of at least one of the membranes and which fills partly or entirely the trench or cavity beneath said at least one membrane.

12. A device according to claim 11, where the dielectric layer is a nitride, an oxide, a glass, an organic material or a combination thereof.

13. A device according to claim 1, wherein at least one of the membranes is formed by dry back etching.

14. A device according claim 1, comprising a buried oxide layer which acts as an etch stop during formation of at least one of the membranes using wet etching.

15. A device according to claim 1, comprising a semiconductor or glass cap placed above the device at a distance from the top surface of the device.

16. A device according to claim 1, the device being a bipolar-MOS structure, such as a lateral insulated gate bipolar transistor (LIGBT); a power Field Effect Transistor (FET), such as a lateral high voltage Metal Oxide Field Effect Transistor (MOSFET); a power Bipolar Junction Transistor (BJT); a power diode or a PIN diode; a superjunction or 3D RESURF high voltage device; a superjunction or 3D RESURF FET; a 3D RESURF bipolar-MOS structure such as a superjunction or 3D RESURF LIGBT; a superjunction or 3D RESURF diode.

17. In combination, a device according to claim 1, and a further high voltage/power device integrated monolithically in the same chip.

18. A combination according to claim 17, wherein at least part of the active area of each of the high voltage/power devices is placed in or on a membrane.

19. In combination, a device according to claim 1, and a high side gate driver in or on at least one further membrane.

20. In combination, a device according to claim 1, and a further high voltage/power device that share a common set of membranes.

21. A method of forming a high voltage/power semiconductor device, the method comprising:

forming, in a layer provided on a semiconductor substrate, a high voltage/power semiconductor device having an active region having a plurality of high voltage junctions electrically connected in parallel;

forming a single low voltage terminal and a single high voltage terminal each for connection to plural of the high voltage junctions such that at least a portion of the low voltage terminal and at least a portion of the high voltage terminal are connected directly or indirectly to a respective one of the high voltage junctions;

removing the semiconductor substrate below at least part of the high voltage junctions such that at least part of each of said high voltage junctions is located in or on a respective membrane whereby the active region is provided at least in part over plural membranes, there being non-membrane regions between said membranes; and, removing at least a portion of the semiconductor substrate below at least those portions of the high voltage terminal that are in direct or indirect contact with one of the high voltage junctions such that at least those portions of the high voltage terminal that are in direct or indirect contact with one of the high voltage junctions are located on or in a respective one of the plural membranes.

22. A method according to claim 21, comprising forming at least one of those portions of the low voltage terminal that are in direct or indirect contact with one of the high voltage junctions on or in a non-membrane region.

23. A method according to claim 22, comprising forming all of those portions of the low voltage terminal that are in direct or indirect contact with one of the high voltage junctions on or in a non-membrane region.

24. A method according to claim 21, comprising forming at least one of the membranes using dry back etching.

25. A method according to claim 21, comprising forming a buried layer that isolates the active area of the device from the semiconductor substrate, said buried layer acting as an etch stop during formation of said at least one of the membranes using wet etching.

26. A method according to claim 21, comprising adding an insulating layer to the top of at least one of the membranes.

27. A method according to claim 21, comprising adding a conformal insulating layer to the bottom of at least one of the membranes.

28. A method according to claim 21, comprising adding an insulating layer to the bottom of at least one of the membranes, said insulating layer filling partly or entirely the trench or cavity beneath said at least one of the membranes.

29. A method according to claim 21, wherein the insulating layer is an oxide, a nitride, an epoxy, a ceramic or an organic material.

30. A method according to claim 21, comprising adding a semiconductor or a glass cap to the top of the device before full encapsulation.

31. A method according to claim 21, comprising sealing the trench or cavity below at least one of the membranes using a polymer, a glass or a metal plate.

* * * * *